(12) United States Patent
Liu et al.

(10) Patent No.: US 12,009,312 B2
(45) Date of Patent: Jun. 11, 2024

(54) SEMICONDUCTOR DEVICE PACKAGE

(71) Applicant: Advanced Semiconductor Engineering, Inc., Kaohsiung (TW)

(72) Inventors: Chanyuan Liu, Kaohsiung (TW); Kuo-Hsien Liao, Kaohsiung (TW); Yu-Hsiang Sun, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 183 days.

(21) Appl. No.: 17/483,720

(22) Filed: Sep. 23, 2021

(65) Prior Publication Data

US 2023/0092873 A1  Mar. 23, 2023

(51) Int. Cl.
*H01L 23/552* (2006.01)
*H01L 23/31* (2006.01)
*H01L 23/498* (2006.01)

(52) U.S. Cl.
CPC ........ *H01L 23/552* (2013.01); *H01L 23/3121* (2013.01); *H01L 23/49811* (2013.01)

(58) Field of Classification Search
None
See application file for complete search history.

(56) References Cited

U.S. PATENT DOCUMENTS

| | | | |
|---|---|---|---|
| 10,163,867 B2 | 12/2018 | Kim et al. | |
| 10,863,656 B2 * | 12/2020 | Otsubo | H01L 25/16 |
| 11,183,465 B2 * | 11/2021 | Otsubo | H01L 23/552 |
| 11,291,108 B2 * | 3/2022 | Otsubo | H05K 9/0024 |
| 11,488,934 B2 * | 11/2022 | Kim | H01L 25/0652 |
| 2022/0254695 A1 * | 8/2022 | Guo | H01L 24/20 |
| 2023/0170310 A1 * | 6/2023 | Kim | H01L 23/3128 |
| | | | 257/659 |

* cited by examiner

*Primary Examiner* — Long Pham
(74) *Attorney, Agent, or Firm* — FOLEY & LARDNER LLP

(57) ABSTRACT

A semiconductor device package and a fabrication method thereof are disclosed. The semiconductor package comprises: a substrate having a first face and an opposing second face, wherein the first face is mounted with a first semiconductor component and a plurality of connectors; and a first shielding member covering the first semiconductor component and a first group of the plurality of connectors, while exposing a second group of the plurality of connectors.

17 Claims, 25 Drawing Sheets

SEMICONDUCTOR DEVICE PACKAGE

BACKGROUND

1. Technical Field

The present disclosure generally relates to semiconductor device packages and manufacturing methods thereof, and pertains particularly to semiconductor package modules with all-aspect electromagnetic interference (EMI) shielding.

2. Description of the Related Art

As the performance of microelectronics increases, the complexity and delicacy of the devices also increases. For one thing, the adverse effects from electromagnetic interference (EMI) become more pronounced.

A common way to reduce EMI is to provide shielding protection for a set of semiconductor devices within a device package. Shielding can be accomplished by providing an electrically conductive casing or housing that is electrically grounded and secured to an exterior of the package module. When electromagnetic emissions from an interior of the package strike an inner surface of the casing, at least a portion of these emissions can be electrically shorted, thereby reducing the level of emissions that can pass through the casing and affect the neighboring devices. Similarly, when electromagnetic emissions from a neighboring semiconductor device strike an outer surface of the casing, a similar electrical shorting can occur to reduce EMI of semiconductor devices within the package.

Conventional EMI shielding solutions are often seen only over the upper quadrants of a package module. For example, metal casings or conducive coatings are often observed only on the top and lateral surfaces of a semiconductor package. However, a reliable yet cost effective all-aspect shielding solution remains a challenge.

SUMMARY

Embodiments of the instant disclosure provides a semiconductor package, which includes: a semiconductor package, which comprises: a substrate having a first face and an opposing second face, wherein the first face is mounted with a first semiconductor component and a plurality of connectors; and a first shielding member covering the first semiconductor component and a first group of the plurality of connectors, while exposing a second group of the plurality of connectors.

Embodiments of the instant disclosure also provides a semiconductor device, which includes: a circuit board having a plurality of conductive pads arranged on a mounting face thereof; and a semiconductor package mounted over the circuit board, the semiconductor package comprises: a substrate having a first face arranged toward the mounting face of the circuit board, wherein the first face is mounted with a first semiconductor component and a plurality of connectors, and a first shielding member extending between a first level corresponding to the plurality of conductive pads and a second level corresponding to the plurality of connectors, wherein the shielding member is in contact with the first semiconductor component.

Embodiments of the instant disclosure further provides an electronic package, which includes a carrier; an electronic component carried by the carrier; a plurality of electrical contacts configured to connect the electronic package to an external electronic device; and a shielding element configured to shield the electronic component from electromagnetic interference; wherein a first portion of the electrical contacts is electrically connected to the shielding element and a second portion of the electrical contacts is electrically dis-connected with the shielding element.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
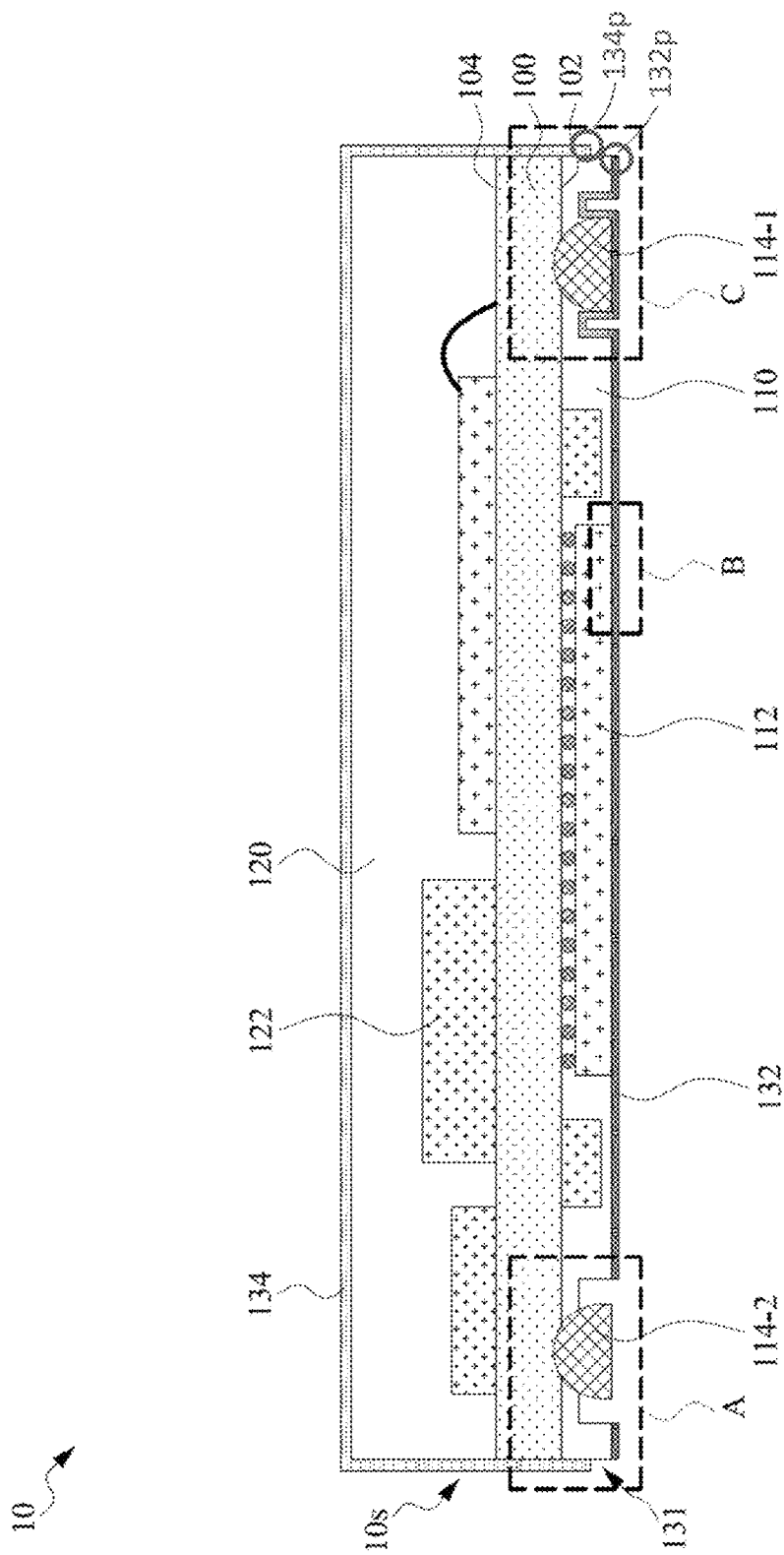
FIG. 1 shows a schematic illustration of a semiconductor package in accordance with some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

As used herein, the term "substrate" generally refers to a base material or construction upon which additional materials are formed. For one thing, on a micro component level, a substrate may refer to a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductor material. On a macro package level, a substrate may refer to components that provide structural support and enable signal connection for other functional device components, such as a printed circuit board (PCB).

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("S·m^−1"). Typically, an electrically conductive material is one having a conductivity greater than about 104 S·m^−1, such as at least about 105 S·m^−1 or at least about 106 S·m^−1. Electrical conductivity of a material can sometimes vary with temperature. Unless otherwise specified, electrical conductivity of a material is defined at room temperature.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure.

FIG. 1 shows a schematic illustration of a semiconductor package in accordance with some embodiments of the instant disclosure. Particularly, FIG. 1 shows a lateral cross sectional depiction of an exemplary semiconductor package 10, which provides visual access to various internal components of the package 10.

According to some embodiments of the instant disclosure, an exemplary semiconductor package (e.g., package module 10) comprises a carrier (e.g., substrate 100) that has a first face 102 (shown as a bottom face/downward facing surface in the illustrated orientation) and an opposing second face 104 (shown as a top face, e.g., upward facing surface in the illustrated orientation).

In some embodiments, an electronic component is carried by the carrier. For instance, on the first face 102 mounted one or more electronic components (e.g., a semiconductor component, such as a first chip/die 112) and a plurality of electrical contacts (e.g., connectors 114-1, 114-2). An encapsulant (e.g., first molding member 110) is disposed around the first die 112, so that the first die 112 is at least partially embedded in the molding member 110. An shielding element (e.g., first shielding member 132) is arranged over the first molding member 110 and configured to cover the first die 112 and a first group of the plurality of the connectors (e.g., connector 114-1), while exposing a second group (e.g., connector 114-2). The shielding element may be configured to shield the electronic component from electromagnetic interference. Moreover, in some embodiments, a first portion of the electrical contacts is electrically connected to the shielding element, while a second portion of the electrical contacts is electrically dis-connected from the shielding element. In some embodiments, the first face 102 is designated to be the inward face, which is orientated toward the mounting surface of a carrier (e.g., a printed circuit board) on which the semiconductor package 10 is mounted. In some embodiments, the opposite second face 104 defines an outward face that faces away the mounting surface of a printed circuit board, thus affording more standoff clearance for its device components (e.g., die/chip 122) than the first face 102. For example, the second face 104 may be mounted with die/chip 122 having a greater thickness than that of the first die 112 on the first face 102.

The substrate 100 may comprise, e.g., a paper-based copper foil laminate, a composite copper foil laminate, or a polymer-impregnated glass-fiber-based copper foil laminate, which serves as a carrier for various package components. The substrate 100 may include an interconnection structure, such as a redistribution layer (RDL) or an interposer. The substrate 100 may be implemented in a number of ways, and includes electrical interconnect to provide electrical pathways between the first face 102 and the second face 104. In some embodiments, the electrical interconnect includes, e.g., a set of electrically conductive layers that are incorporated within a set of dielectric layers. In some embodiments, the electrically conductive layers are connected to one another by internal vias, and can be implemented so as to sandwich a core formed from a suitable resin, such as one based on bismaleimide and triazine or based on epoxy and polyphenylene oxide. In some embodiments, the substrate 100 includes a substantially slabs shaped core that is sandwiched by one set of electrically conductive layers disposed adjacent to an upper surface of the core and another set of electrically conductive layers disposed adjacent to a lower surface of the core. For certain implementations, a thickness of the substrate 100, namely a distance between the first face 102 and the second face 104, may be in the range of about 0.1 millimeter ("mm") to about 2 mm, such as from about 0.2 mm to about 1.5 mm or from about 0.4 mm to about 0.6 mm. While not illustrated explicitly in FIG. 1, it is contemplated that a solder mask layer may be disposed adjacent to either, or both, the first face 102 and the second face 104 of the substrate 100.

The illustrated semiconductor package 10 is of a double side molding (DSM) configuration, which further comprises a second molding member 120 disposed over device components (e.g., die/chip 122) mounted on the second face 104 of the substrate 100. The exemplary DSM module (e.g., package 10) is further provided with a second shielding member 134 configured to cover the second molding member 104 to maximize electromagnetic interference (EMI) shielding performance and thermal exchanging capacity. In some embodiments, the first shielding member (e.g., bottom shielding) 132 and the second shielding member (e.g., top shielding) 134 are of separate constructions. In the illustrated embodiment, at least a portion of the second shielding member 134 disjoints the first shielding member 132, e.g., by a gap 131. In some embodiments, the second shielding member 134 and the first shielding member 132 are physically separated.

In some embodiments, the gap (e.g., gap 131) between the first shielding member 132 and the second shielding member 134 is formed with a linear profile that traverses across a periphery surface (e.g., lateral face 10*s*) of the semiconductor package 10. In some embodiments, the gap 131 is formed with an annular profile that traverses continuously around lateral faces of the semiconductor package 10.

In the illustrated embodiment, the first shielding member 132 is configured to provide planar coverage over the first face 102 of the substrate 100. On the other hand, the second shielding member 134 is configured to provide three dimensional/multi-face coverage over the second face 104 of the substrate 100. For instance, the exemplary second shielding member 134 is formed with a substantially conformal structure that covers over five (5) upward-exposed faces of the second molding member 120.

Figure 2C:
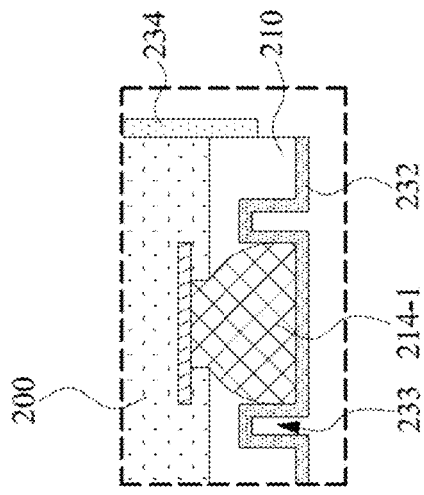
FIGS. 2A-2D show schematic local enlargement views of a semiconductor package in accordance with some embodiments of the instant disclosure.
Figure 2B:
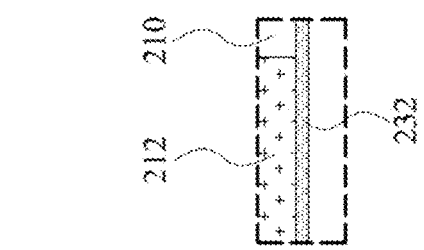

In some embodiments, the upper periphery of the lower shielding member (e.g., first shielding member 132) at a sidewall of the semiconductor package 10 defines a highest boundary 132*p*, and the lower periphery of the upper shielding member (e.g., second shielding member 134) at a sidewall of the semiconductor package 10 defines a lowest boundary 134*p*. As shown in various embodiments of the disclosure, the highest boundary 132*p* of the lower shielding member and the lowest boundary 134*p* of the upper shielding member are situated at different elevations (e.g., as illustrated in FIGS. 2C and 2D; at a vertical level with respect to the orientation shown in the instant illustration). The gap 131 is formed over a periphery portion of the first molding member 110, thereby exposing a lateral portion of the insulating surface of the first molding member 110.

In some embodiments, the shielding member (e.g., members 132 and/or 134) is a conformal shield formed with one more layers of conductive films. In some embodiments, the shielding member is formed adjacent to and in direct contact with an exterior surface of the semiconductor package (e.g., over the exterior surface of the molding members 110 and/or 120). The conformal characteristics of the shielding members may allow similar EMI shields and similar manufacturing operations to be readily applied to semiconductor packages of different sizes and shapes, thereby reducing manufacturing cost and time to accommodate the different packages.

In general, each of the shielding members 132, 134 may be formed from one or more layers of conductive thin film that comprises, e.g., a metal, a metal alloy, a matrix with a metal or a metal alloy dispersed therein, or another suitable electrically conductive material. For example, each of the shielding members may be formed from aluminum (Al), copper (Cu), chromium (Cr), tin (Sn), gold (Au), silver (Ag), nickel (Ni), stainless steel, or a combination thereof. In some embodiments, the first and the second shielding members 132, 134 may be formed with comparable techniques. In some embodiments, the first and the second shielding members 132, 134 are formed with different deposition processes. Applicable deposition processes may include physical thin film deposition processes such as sputtering, spray coating, and electroplating techniques. In some embodiments, the first the second shielding members 132, 134 can be formed by metal film pasting.

For different practical applications or operating requirements, the first shielding member 132 and the second shielding member 134 may be formed from the same electrically conductive material or different electrically conductive materials. For example, a metal, such as copper, can be selected for both the first shielding member 132 and the second shielding member 134. In some instances, different electrically conductive materials can be selected for the upper and the lower shielding members (e.g., members 132, 134) provide complementary functionalities. In some embodiments, a metal with a higher electrical conductivity, such as aluminum, copper, gold, or silver, can be selected to provide enhanced EMI shielding and/or heat dissipating functionality. In some embodiments, a metal with a somewhat lower electrical conductivity, such as nickel, can be selected for its ability to protect the package components against oxidation, humidity, and other environmental conditions. In this case, the shielding member may also contribute to the EMI shielding functionality while providing ambient protection.

For certain implementations, a thickness of the shielding members (e.g., members 132 and/or 134) may be in the range of about 1 μm to about 500 μm, such as from about 1 μm to about 100 μm, from about 1 μm to about 50 μm, or from about 1 μm to about 10 μm. Such reduced thickness of the shielding member, relative to a typical shielding case, helps to facilitate the reduction of overall package size.

In the illustrated embodiment, the device components (e.g., chip/die 112, 122) are mounted over both faces (e.g., the first and the second faces 102, 104) of the substrate to maximize utilization of the valuable space within the semiconductor package. The device components may be disposed on the planar surface (e.g., faces 102, 104) of the substrate through suitable arrangements such as flip chip or wire bonding configurations. In some embodiments, the electronic component may be an active component, such as a chip or a semiconductor die. In some embodiments, the device components may include passive devices, e.g., resistors, capacitors, inductors, filters, diplexers, or a combination thereof.

In the illustrated embodiment, the first die 112 is mounted to the first face 102 of the substrate 100 through flip chip arrangement. The exemplary embodiment shows the first die 112 having greater standoff height over its neighboring components. For instance, the centrally arranged first die 112 is partially embedded in the first molding member 110. Particularly, only the lateral surfaces of the first die 112 is in contact with the molding material, while the downward facing surface thereof being exposed from the first molding member 110. In addition, the downward facing surface of the first die 112 is in contact with the first shielding member 132.

The direct contact interface between the first die 112 and the first shielding member 132 (e.g., as enclosed in the zoom box (B) in FIG. 1) not only enables low profile EMI shielding solution for the bottom facing components but also establishes an effective thermal dissipation route from the enclosed package components to the exposed shielding member (e.g., member 132).

A plurality of electrical contacts/connectors are arranged around the centrally placed device components. For instance, in the illustrated embodiment, connectors 114-1, 114-2 are placed respectively on either side of the first die 112 near the lower periphery region of the package. The exemplary connectors 114-1, 114-2 may belong to different groups of connectors that are configured to serve different functions. For example, as shown in the zoom box (C) of FIG. 1, connector 114-1 (which is covered by and in electrical contact with the conductive material of the first shielding structure 132) may belong to a first group of connectors that serve as ground pads. On the other hand, as shown in the zoom box (A) of FIG. 1, connector 114-2 (which are exposed from the first shielding member 132) may belong to a second group of connectors that serve as functional pads. In some embodiments, the shielding element (e.g., element 132) encompasses the electronic component (e.g., component 112) and the first portion of the electrical contacts (e.g., first group connectors 114-1). In some embodiments, the shielding element exposes the second portion (e.g., second group connectors 114-2) of the electrical contacts. In some embodiments, the connectors 114-1, 114-2 take the form of solder balls (or at least a portion thereof). In some embodiments, a number of the first group connectors is greater than a number of the second group connectors.

FIG. 2 shows schematic local enlargement views of a semiconductor package in accordance with some embodiments of the instant disclosure. For instance, the regionally enlarged view of FIG. 2(A) illustrates a schematic sectional arrangement of a functional pad (e.g., connector 214-2); the regionally enlarged view of FIG. 2(B) illustrates a schematic sectional arrangement of a boundary interface between a package die (e.g., die 212) and a shielding member (e.g., member 232); the regionally enlarged view of FIG. 2(C) illustrates a schematic sectional arrangement of a ground pad (e.g., connector 214-1); the regionally enlarged view of FIG. 2(D) illustrates an alternative arrangement of a ground pad region, similar to that shown in FIG. 2(C).

Figure 2A:
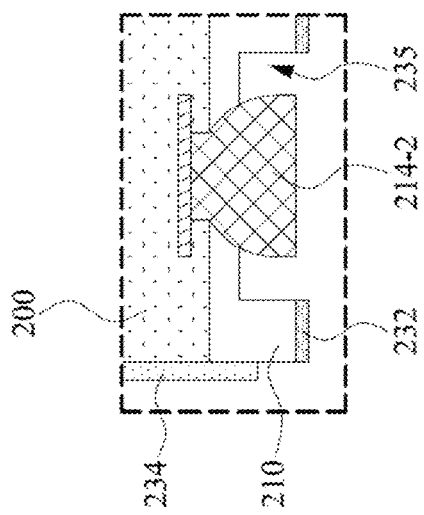
Figure 2D:
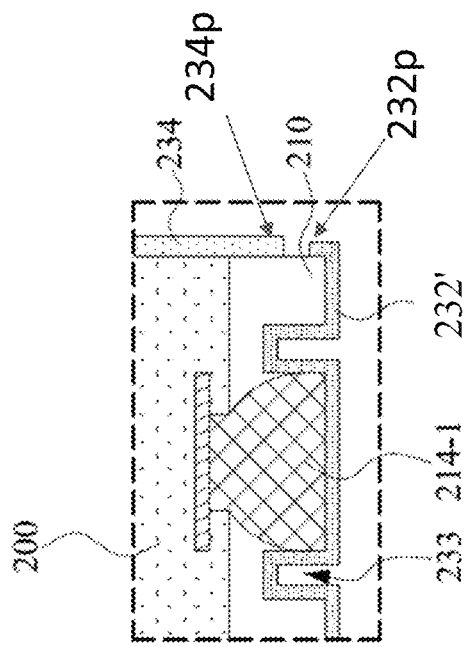

Referring to FIG. 2(A), a shielding element (e.g., structure 232) is disposed on an outer surface of the encapsulant (e.g., molding structure 210) and the electrical contacts (e.g., connector 214-2) are exposed from the outer surface of the encapsulant. In the exemplary embodiment, the exemplary connector 214-2 takes the form of a grinded-off solder ball. For instance, the bottom half of a spherical solder ball is removed/flattened and thus exposed from a molding structure 210, e.g., via a planarization process. In some embodiments, the exposed group of the connectors (e.g., connector 214-2) are configured to serve as functional pads. In some embodiments, the periphery region of the connector 214-2 is processed to form a standoff trench feature (e.g., recess/trench 235) to ensure proper clearance with a subsequently formed conductive shield (e.g., shielding member 232), thereby prevent shorting issues. In some embodiments, in a subsequent selective deposition process, the second group of connectors (e.g., connector 214-2) are exposed from the shielding member (e.g., member 232) through an annular trench 235 defined in the molding member (e.g., member 210).

Referring to FIG. 2(B), the encapsulant (e.g., molding structure 210) encapsulates the electronic component (e.g., die 212). the boundary interface between package die 212, the embedding molding member 210, and the shielding member 232 that covers there-over. As schematically illustrated, a downward facing surface of the die 212 is substantially flush with a lower boundary of the molding member 210. For instance, in the illustrated embodiment, the bottom face of die 212 is exposed from the surrounding molding compound (of member 210). The shielding structure 232 then provides substantially planar coverage over both the molding member 210 and the die 212. In some embodiments, a coplanar configuration between the lower surfaces of the die 212 and the surrounding molding compound (of member 210) aids the facilitation of adhesion between the hetero-material interface, which in turn helps to increase structural integrity of the package and mitigates delamination issues.

Referring to FIG. 2(C), the shielding element (e.g., structure 232) contacts at least one of the first portion of electrical contacts (e.g., connector 214-1). In the exemplary embodiment, connector 214-1 also takes the form of a grinded-off solder ball. For instance, the bottom half of a spherical solder ball is removed/flattened and thus exposed from the molding structure 210. The conductive material of the shielding member 232 is then disposed over the flattened surface of the connector 214-1 and form signal and thermal connection. In some embodiments, the shielded group of the connectors (e.g., connector 214-1) are configured to serve as ground pads, and are collectively connected to the shielding member 232. In some embodiments, the periphery region of the connector 214-1 is processed to form a surrounding trench (e.g., around the recess/trench feature 233). In some embodiments, conductive material of the first shielding member 232 is disposed over the flattened bottom surface of connector 214-1 and the surrounding trench (e.g., in a substantially conformal fashion), thereby forming an annular trench feature 233 in the conductive shielding member 232 (e.g., in the vicinity of the first group of connectors 214-1). On the other hand, the shielding member 232 is spaced apart from at least one of the second portion of the electrical contacts (e.g., second group connectors 214-2).

Referring to FIG. 2(D), the exemplary shielding element 232' is provided with a slightly different profile. In the illustrated embodiment, the lower shielding element 232', while being structurally separated from the upper shielding element, has an end portion that crawls up to the lateral surface of the molding member 210. Accordingly, the lower shielding member 232' defines a highest boundary 232p, while the upper shielding member 234 defines a lowest boundary 234p at different elevations different from that of the boundary 232p.

Figure 3:
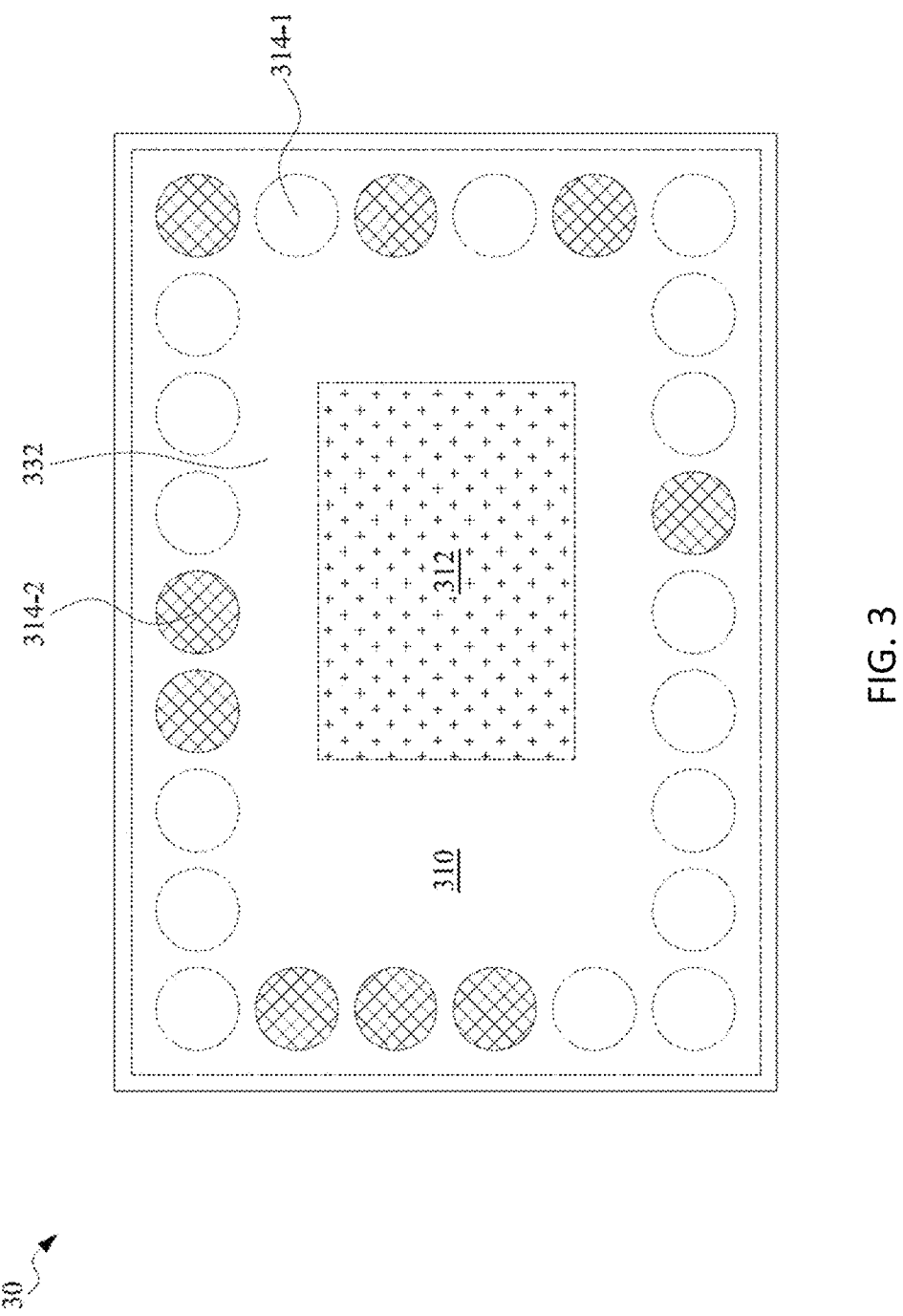
FIG. 3 shows a schematic planar layout view of a semiconductor package in accordance with some embodiments of the instant disclosure.

FIG. 3 shows a schematic planar layout view of a semiconductor package in accordance with some embodiments of the instant disclosure. For instance, the schematic planar layout shows an exemplary package 30 having a plurality of electrical connectors (e.g., connectors 314-1, 314-2) arranged around a centrally placed device component (e.g., die 312).

In the illustrated embodiment, connectors 314-1, 314-2 are distributed over a bottom face (e.g., defined by a molding structure 310) of the exemplary package 30 and laterally encircles the die 312 around the periphery region of the bottom face. It is noted that, while being visibly depicted in the schematic illustration (in a partially see-through fashion), some of the connectors (e.g., the first group connectors 314-1) are to be covered by the shielding member 332 and therefore will be obstructed from actual view (e.g., from a bottom viewing angle).

The exemplary connectors 314-1, 314-2 belong to different groups of connectors that are configured to serve different functions. For example, connectors 314-1 (which is covered by and in electrical contact with the conductive material of the first shielding structure 332) belong to a first group of connectors that serve as ground pads. On the other hand, connectors 314-2 (which are exposed from the first shielding member 332) belong to a second group of connectors that serve as functional pads. In the illustrated embodiment, the number of the first group connectors 314-1 is greater than the number of the second group connectors 314-2.

Figure 4:
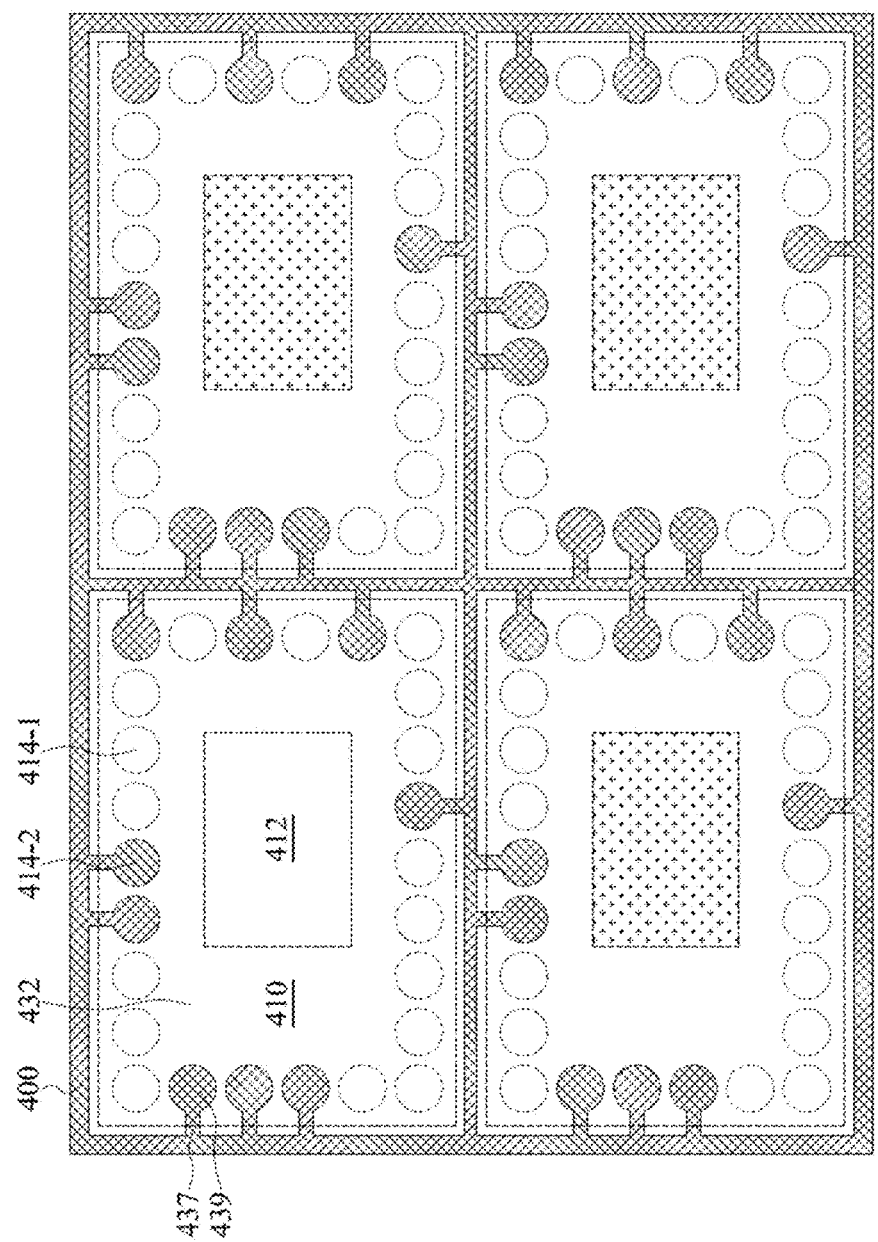
FIG. 4 shows a schematic planar layout view of semiconductor packages during an exemplary fabrication stage in accordance with some embodiments of the instant disclosure.

FIG. 4 shows a schematic planar layout view of semiconductor packages during an exemplary fabrication stage in accordance with some embodiments of the instant disclosure. For instance, the planar layout shows a plurality (e.g., four) exemplary packages being placed in a two by two (2×2) array during in intermediate fabrication stage (e.g., before package singulation). Each of the package has a plurality of electrical connectors (e.g., connectors 414-1, 414-2) arranged around a centrally allocated device component (e.g., die 412).

Selective shielding of the first group connectors 414-1 (or, the selective exposure of the second group connectors 414-2) may be attained in a variety of ways. For instance, in some embodiments, a reusable mask 400 (e.g., a frame-type mask) may be used over the un-diced packages during shield deposition process to provide selective masking of the first group connectors 414-1 simultaneously across the package array. In some embodiments, the mask 400 comprises a grid type frame body having a plurality of runner extensions (e.g., runner feature 437) extending respectively inward in correspondence with the locations of the second group connectors 414-2. At the other end of the runner extension may be a widened circular mask feature (e.g., feature 439) that is slightly larger than the planar projection of a corresponding connector 414-2. Accordingly, the masking features (e.g., runner feature 437 and the mask feature 439) may cooperatively provide selective masking (of the second group connectors 414-2) during the formation process of the shielding member 432 (e.g., a physical thin film deposition process such as sputtering). In such embodiments, the resultant shielding member 432 may be formed with a plurality of notch profiles (e.g., corresponding to the shape and location of the masking feature 437) along an edge portion of the conductive shield, where each of the notch profile would be adjacent to the exposed second group connectors 414-2.

In other embodiments, masking patterns (e.g., photoresist/PR, not shown in the instant figure) may be used to achieve selective exposure of the second group connectors (e.g., connector 414-2). For instance, a layer of photosensitive material may be uniformly disposed over the planar surface of the package array. Corresponding masking patterns may then be developed and thus transferred to the photo resist layer to form a soft mask, which may eventually be removed after the deposition process for the shielding member 432. In such embodiments, the edge region of the package bottom face may not possess a notch feature as depicted above.

Figure 5:
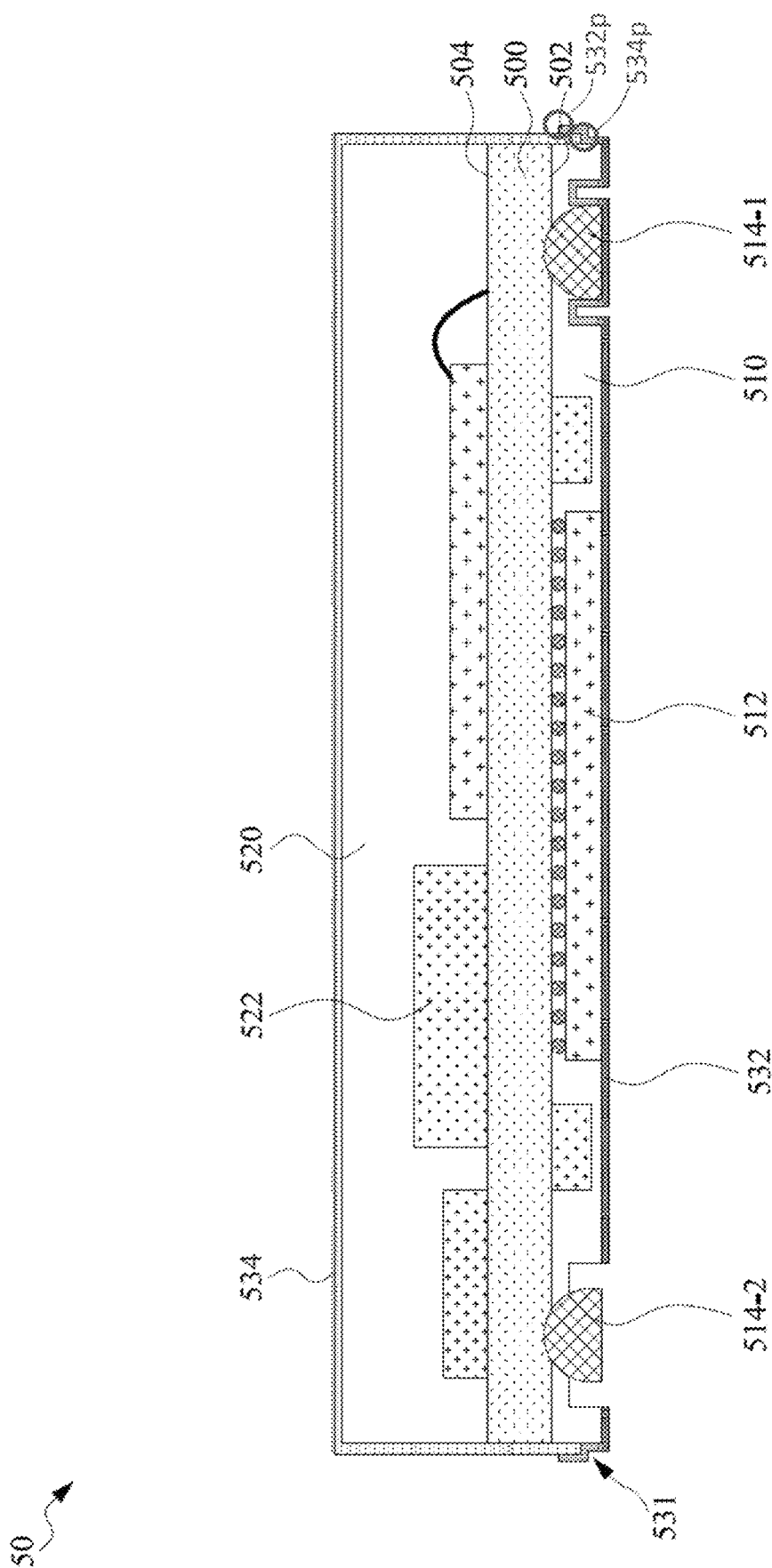
FIG. 5 shows a schematic illustration of a semiconductor package in accordance with some embodiments of the instant disclosure.

FIG. 5 shows a schematic illustration of a semiconductor package in accordance with some embodiments of the instant disclosure. Particularly, FIG. 5 shows a lateral cross sectional depiction of an exemplary semiconductor package 50 that provides visual access to various internal components thereof.

According to some embodiments of the instant disclosure, an exemplary semiconductor 50 comprises a carrier (e.g., substrate 500) having a first face 502 and an opposing second face 504. On the first face 502 mounted a plurality of electronic components (e.g., a first die 512) and a plurality of connectors (e.g., connectors 514-1, 514-2). A first molding member 510 is disposed around the first die 512, so that the first die 512 is at least partially embedded therein. A first shielding member 532 is arranged over the first molding member 510 and configured to cover the first die 512 and a first group of the plurality of the connectors (e.g., connector 514-1) while exposing a second group (e.g., connector 514-2). Moreover, in the illustrated embodiment, a first part (e.g., the bottom planar portion) of the shielding member 532 is disposed on the bottom side of the substrate 500 and configured to shield the electronic component (e.g., first die 512) from electromagnetic interference from the bottom side of the carrier.

The illustrated semiconductor package 50 is of a double side molding (DSM) configuration, which further comprises a second molding member 520 disposed over device components (e.g., chip 522) mounted on the second face 504 of the substrate 500. To attain multi-aspect EMI shielding and thermal dissipation capability, the package module is further provided with a second shielding member 534 configured to cover the second molding member 520. In some embodiments, at least a portion of the first shielding member 532 and the second shielding member 534 are joined together. In some embodiments, the conductive material of one shielding member may overlap the conductive material of the other. For instance, in the illustrated embodiment, the conductive material of the first shielding member 532 partially overlaps (e.g., externally creeps onto) the conductive material of the second shielding member 534 around a lateral face of the semiconductor package 50 (e.g., at periphery region 531). In some embodiments, the partial overlap between the upper and lower shielding members (e.g., members 534, 532) creates a continuous ring-like interface with greater thickness around the lateral surfaces of the package module. In some embodiments, the upper periphery of the lower shielding member (e.g., first shielding member 532) at a sidewall of the semiconductor package 50 defines a highest boundary 532$p$, and the lower periphery of the upper shielding member (e.g., second shielding member 534) at a sidewall of the semiconductor package 50 defines a lowest boundary 534$p$. As shown in various embodiments of the disclosure, the highest boundary 532$p$ of the lower shielding member and the lowest boundary of the upper shielding member 534$p$ are situated at different elevations. In some embodiments, the second shielding member 534 and the first shielding member 532 overlaps each other.

Figure 6:
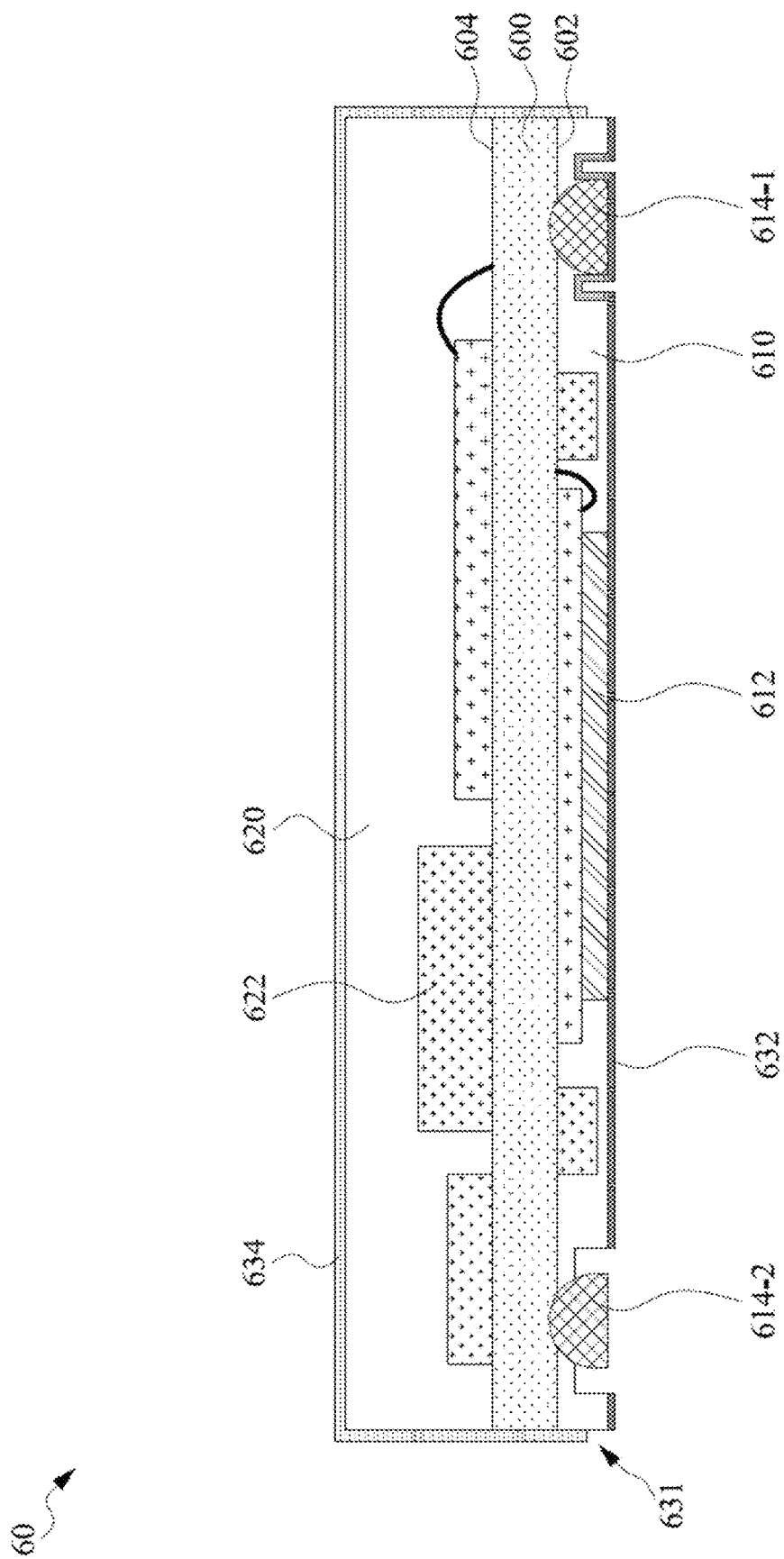
FIG. 6 shows a schematic illustration of a semiconductor package in accordance with some embodiments of the instant disclosure.

FIG. 6 shows a schematic illustration of a semiconductor package in accordance with some embodiments of the instant disclosure. Particularly, FIG. 6 shows a lateral cross sectional depiction of an exemplary semiconductor package 60 that provides visual access to various internal components thereof.

According to some embodiments of the instant disclosure, an exemplary semiconductor package 60 (e.g., package module) comprises a substrate 600 having a first face 602 and an opposing second face 604. On the first face 602 mounted a plurality of electronic components (e.g., a first die 612) and a plurality of connectors (e.g., connectors 614-1, 614-2). A first molding member 610 is disposed around the first die 612, so that the first die 612 is at least partially embedded therein. A first shielding member 632 is arranged over the first molding member 610 and configured to cover the first die 612 and a first group of the plurality of the connectors (e.g., connector 614-1) while exposing a second group (e.g., connector 614-2). The remaining components comparable to those depicted in previous embodiments will not be discussed individually for the sake of brevity of disclosure.

In the instant embodiment, the first die 612 is mounted onto the substrate 600 through wire bonding arrangement, and is fully embedded in the first molding member 610. In this exemplary embodiment, the first die 612 establishes connection (e.g., electrical or thermal contact) with the first shielding member through a heat sink 616. In some embodiments, the heat sink 616 may employ thermally conductive materials capable of facilitating heat transfer, such as metal or thermal conductive plastic.

Figure 7:
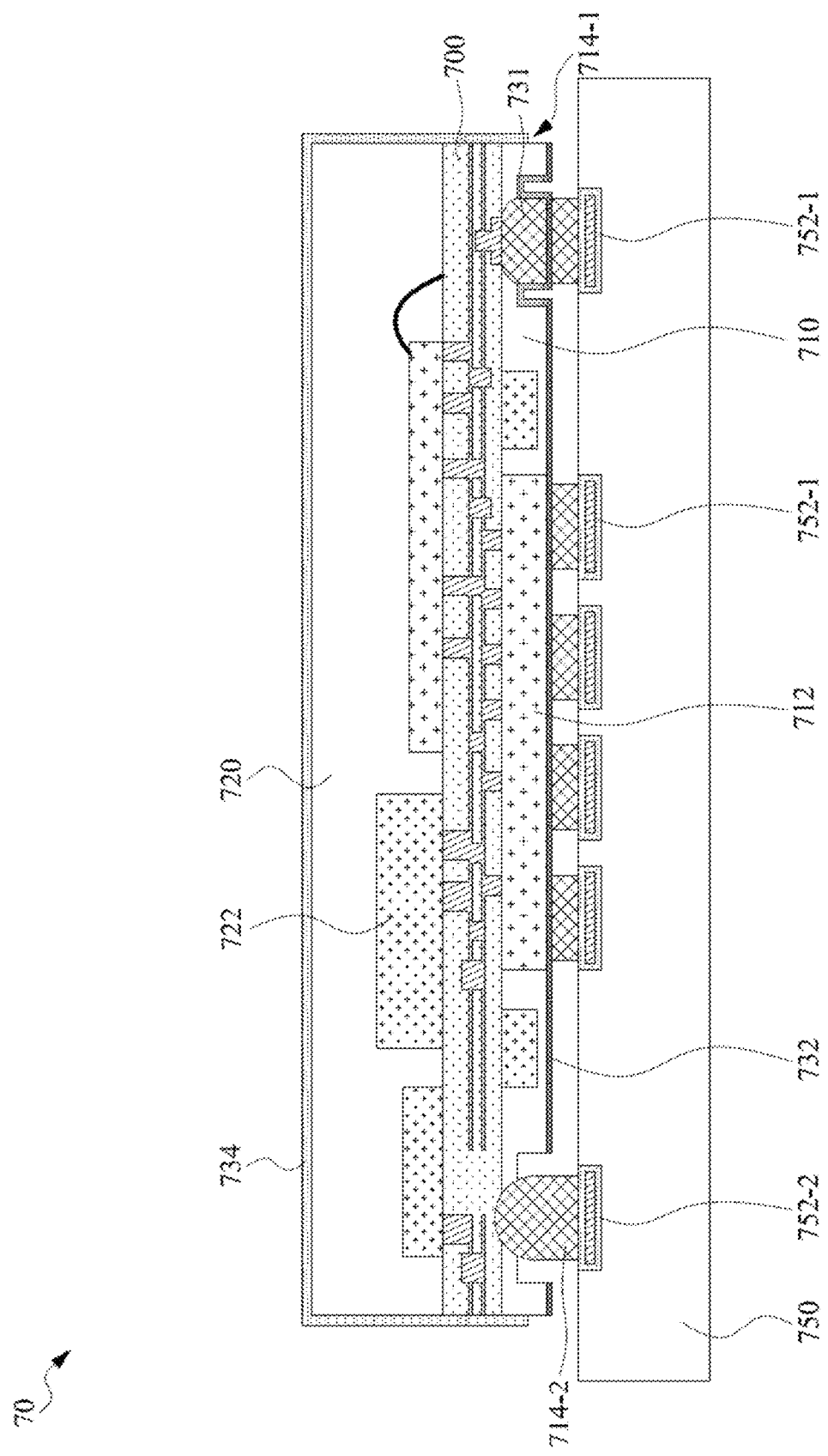
FIG. 7 shows a schematic illustration of a semiconductor device in accordance with some embodiments of the instant disclosure.

FIG. 7 shows a schematic illustration of a semiconductor device in accordance with some embodiments of the instant disclosure. For instance, FIG. 7 shows a semiconductor device 70 that comprises a package module in accordance with embodiments of the instant disclosure mounted on a circuit board 750. It is noted that, some of the illustrated components comparable to those depicted in previous embodiments may not be discussed individually for the sake of disclosure brevity.

In some embodiments, the semiconductor device 70 comprises a circuit board 750 having a plurality of conductive pads (e.g., pads 752-1, 752-2) arranged on a mounting face thereof, and a semiconductor package module mounted over the circuit board 750. In the illustrated embodiment, the package module comprises a substrate 700 having a first face arranged toward the mounting face of the circuit board. The first face of the substrate 700 is mounted with a plurality of device components (e.g., including a first die 712) and a plurality of connectors (e.g., connectors 714-1, 714-2). The package module further comprises a first shielding member 732 that may be comparable to that depicted in the previous embodiments. Upon coupling of the package module onto the circuit board 750, the first shielding member 732 extends between one of the plurality of conductive pads (e.g., pads 752-1) and one of the plurality of connectors (e.g., connector 714-1).

In some embodiments, the plurality of conductive pads of the circuit board 750 may be divided into a first group (e.g., pads 752-1) that correspond to the ground pads (e.g., connector 714-1) and the die 712 covered under the shielding structure 732 of the package module. The first group of pads 752-1 may serve for grounding and heat exchanging purposes. For instance, in the illustrated embodiment, some of the first group pads 752-1 are arranged to projectively overlap the die 712 of the package module.

In the illustrated embodiment, the package module further comprises a second molding member 720 that encapsulates a second face of the substrate 700, and a second shielding member 734 that covers over the second molding member 720. Moreover, in the instant embodiment, the first shielding member 732 disjoints the second shielding member 734 (e.g., through a gap 731). In some embodiments, the first shielding member 732 comprises a first conductive material. In some embodiments, the second shielding member comprises a second conductive material different from the first conductive material.

Figure 8:
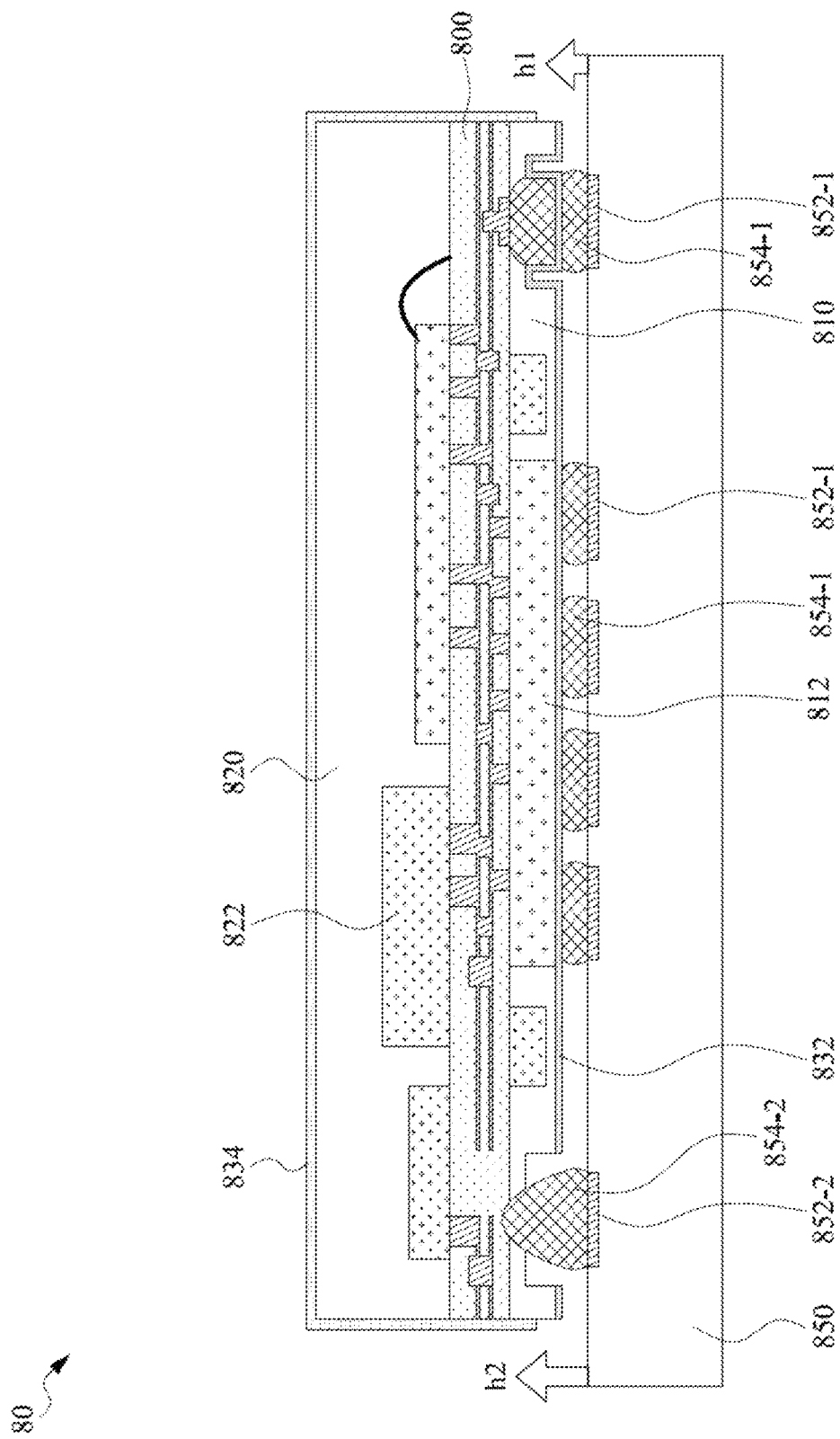
FIG. 8 shows schematic illustration of a semiconductor device in accordance with some embodiments of the instant disclosure.

FIG. 8 shows schematic illustration of a semiconductor device in accordance with some embodiments of the instant disclosure. For instance, FIG. 8 shows a semiconductor device 80, which comprises a circuit board 850 mounted with a package module in accordance with embodiments of the instant disclosure. It is noted that, some of the illustrated components comparable to those depicted in previous embodiments may not be discussed individually for the sake of disclosure brevity.

In some embodiments, the semiconductor device 80 comprises a circuit board 850 having a plurality of conductive pads (e.g., pads 852-1, 852-2) arranged on a mounting face thereof, and a package module mounted over the circuit board 850. In the illustrated embodiment, a first face of the substrate 800 is mounted toward the circuit board 850, on which a plurality of device components (e.g., die 812) and connectors (e.g., connectors 814-1, 814-2) are disposed. The package module further comprises a first shielding member 832 that may be comparable to that depicted in the previous embodiments.

In some embodiments, the shielding member 832 is in thermal contact with one of the plurality of conductive pads (e.g., pad 852-1) through solder connectors (e.g., solder 854-1). In such embodiments, the thickness of the solder connectors may increase a standoff height (clearance) of the package module over the circuit board 850. In the illustrated embodiment, the connector (e.g., solder 854-1) between the first shielding member 832 and one of the plurality of conductive pads (e.g., pad 852-1) defines a first standoff height h1. In some embodiments, one of the plurality of connectors (e.g., connector 854-2, which is exposed from the first shielding member 832) defines a second standoff height h2. In the illustrated embodiment, the second height h2 is greater than the first height h1.

In some embodiments, some of the pads on the circuit board 850 may be thermal pads configured for heat exchange purposes (e.g., the central pads 852-1 projectively under die 812). Aside from providing an enhanced, all-aspect EMI shielding capability for the package module, the inward facing shielding member 832 may serve the additional function as an integrated thermal exchanger that aids heat dissipation from the package module (through the solder 854-1) to the circuit board 850.

FIG. 9 shows schematic illustration of a semiconductor package during various stages of fabrication in accordance with some embodiments of the instant disclosure. Please note that, the element numerals of some prior-labeled components may be omitted in subsequent drawings for the clarity of illustration.

Figure 9A:
FIGS. 9A-9F show schematic illustration of a semiconductor package during various stages of fabrication in accordance with some embodiments of the instant disclosure.

Referring to FIG. 9(A), an exemplary fabrication process initiates by the receipt of a substrate 900 that has a downward facing surface (e.g., a first face) and an upward facing surface (e.g., a second face), with respect to the presently illustrated orientation.

Figure 9B:
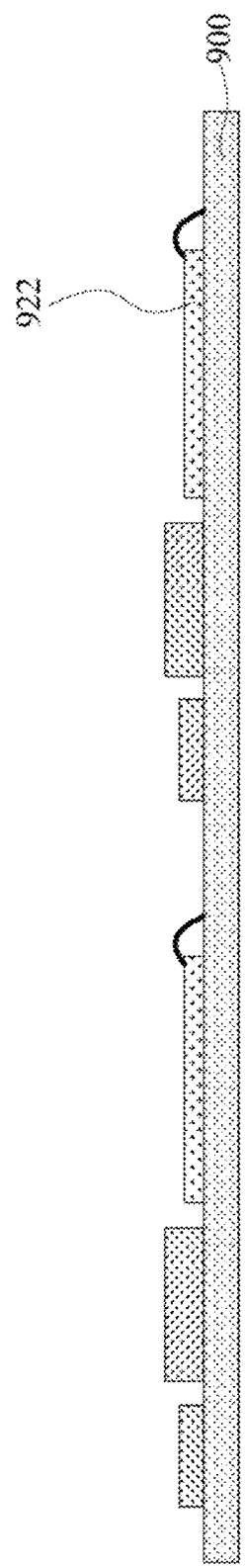

Referring to FIG. 9(B), a plurality of device components (e.g., die 922) are disposed over the upward facing surface of the substrate 900. They device components may be mounted onto the substrate 900 using a variety of suitable methods, including flip chip or wire bonding techniques.

Figure 9C:
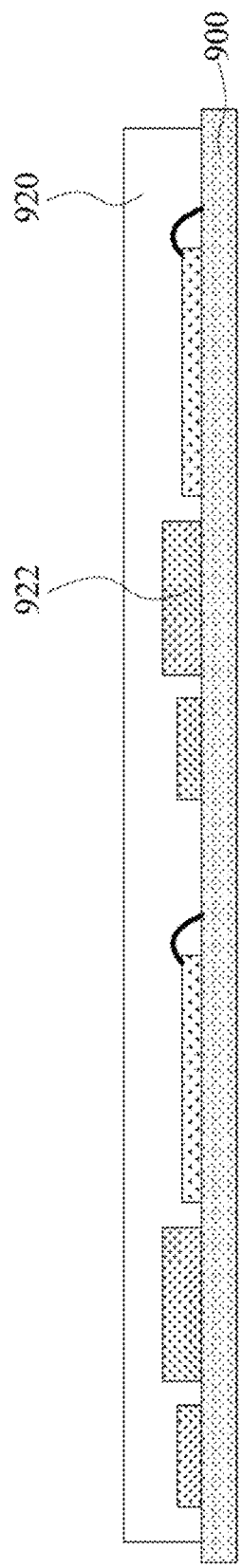

Referring to FIG. 9(C), molding compound 920 is disposed over the second face of the substrate 900 to form molding member that encapsulate the device components (e.g., die 922).

Figure 9D:
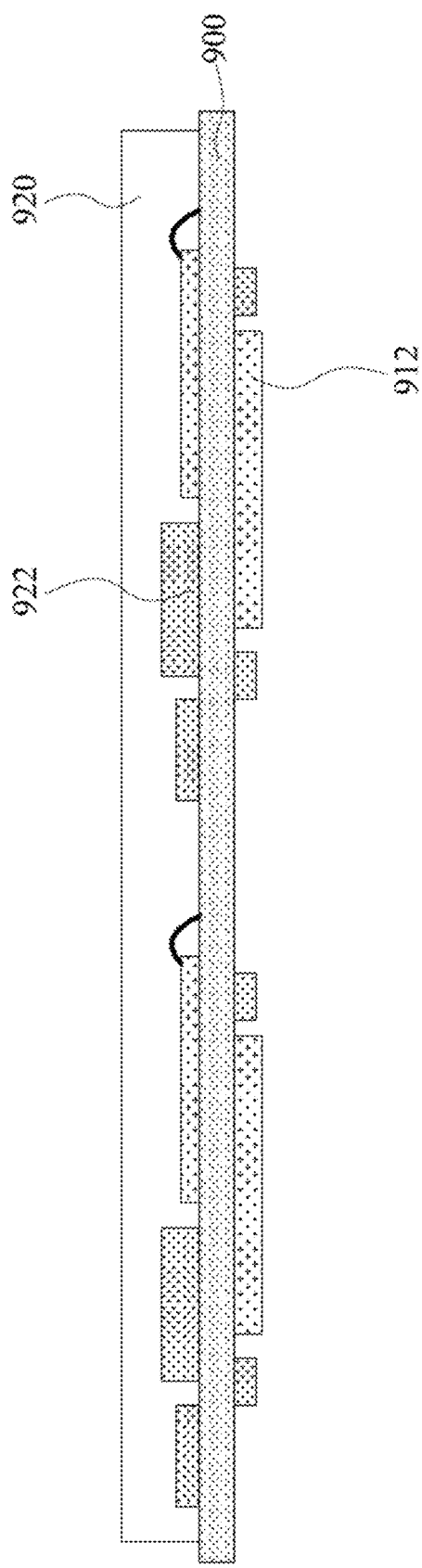

Referring to FIG. 9(D), a plurality of device components (e.g., die 912) are arranged over the first face of the substrate 900. In some embodiments, a device density over the first face of the substrate may be less than that over the second face, so as to reserve sufficient area budget to accommodate plurality of connectors.

Figure 9E:
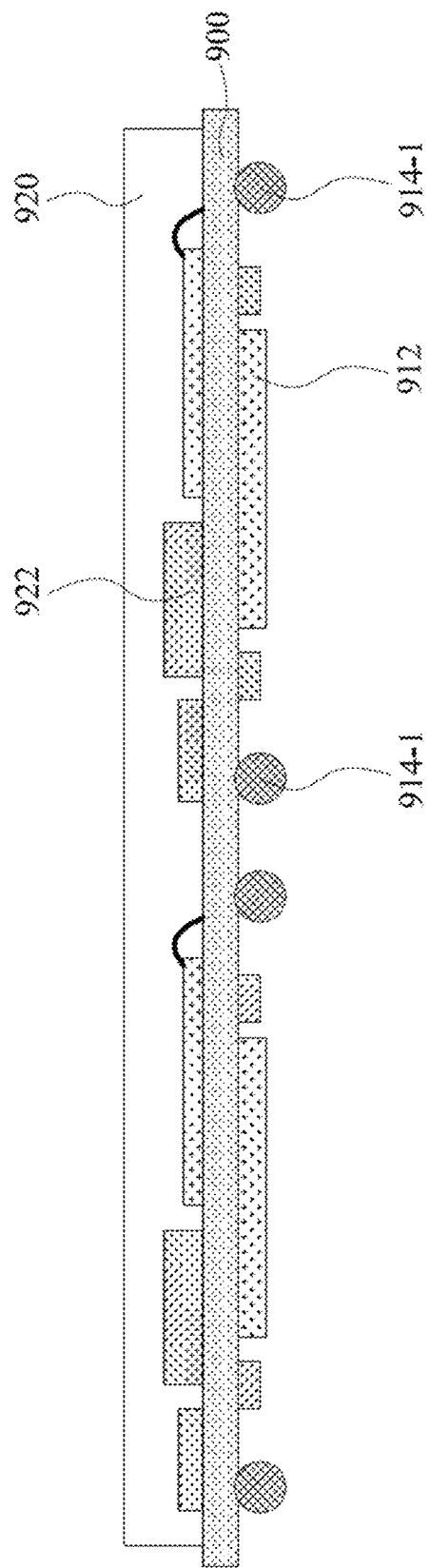

Referring to FIG. 9(E), a plurality of connectors (e.g., solder connectors 914-1, 914-2) are disposed over the second face of the substrate 900 around the device components (e.g., 912). In some embodiments, the connectors are distributed to laterally surround the die 912 around the periphery region of the second face. In general, the connectors (e.g., connectors 914-1, 914-2) would possess sufficient thickness over that of the mounted device components (e.g., die 912) to ensure proper clearance in the subsequent fabrication processes. In some embodiments, the connectors may take the form of a single solder ball of sufficient diameter. In some embodiments, a stack of multiple solder balls with smaller diameter may be utilized. In some applications, a variety of other connecting arrangements may be employed (as exemplified in, e.g., FIG. 12).

Figure 9F:
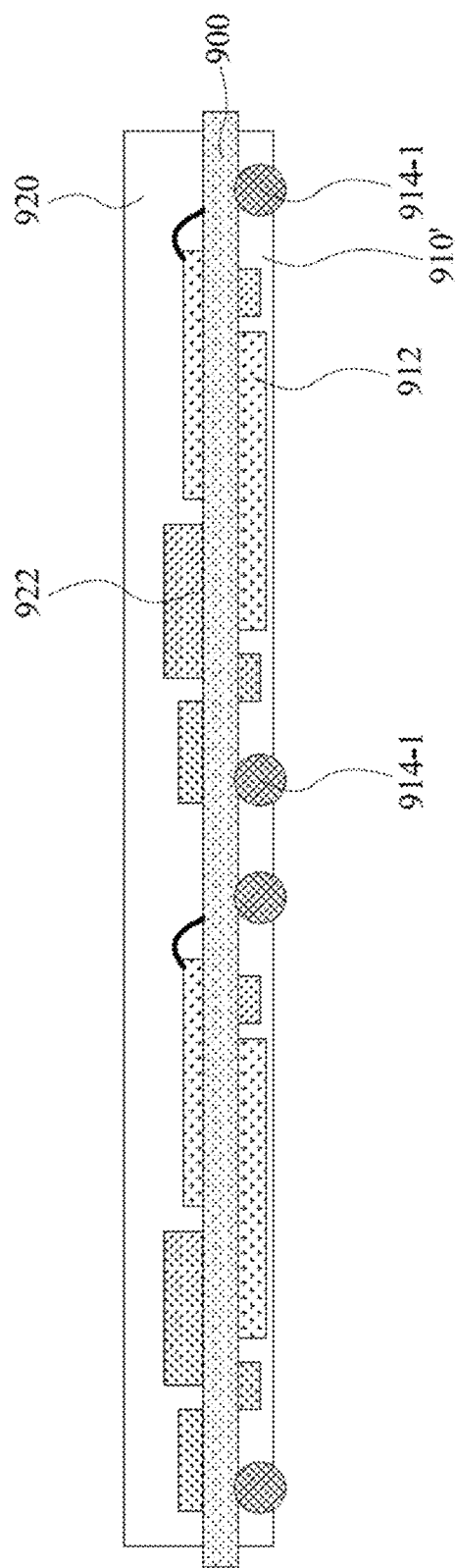

Referring to FIG. 9(F), molding compound 910' is disposed over the second face of the substrate 900 to encapsulate the device components (e.g., die 912). In some embodiments, the lower portion of the connectors (e.g., 914-1, 914-2) are exposed (e.g., partially exposed) from the molding material 910', while the deice components mounted at the central portion of the second face (e.g., die 912) are fully embedded in the molding compound 910'.

FIG. 10 shows schematic illustration of a semiconductor package during various stages of fabrication in accordance with some embodiments of the instant disclosure. Please note that, the element numerals of some prior-labeled components may be omitted in subsequent drawings for the clarity of illustration.

Figure 10A:
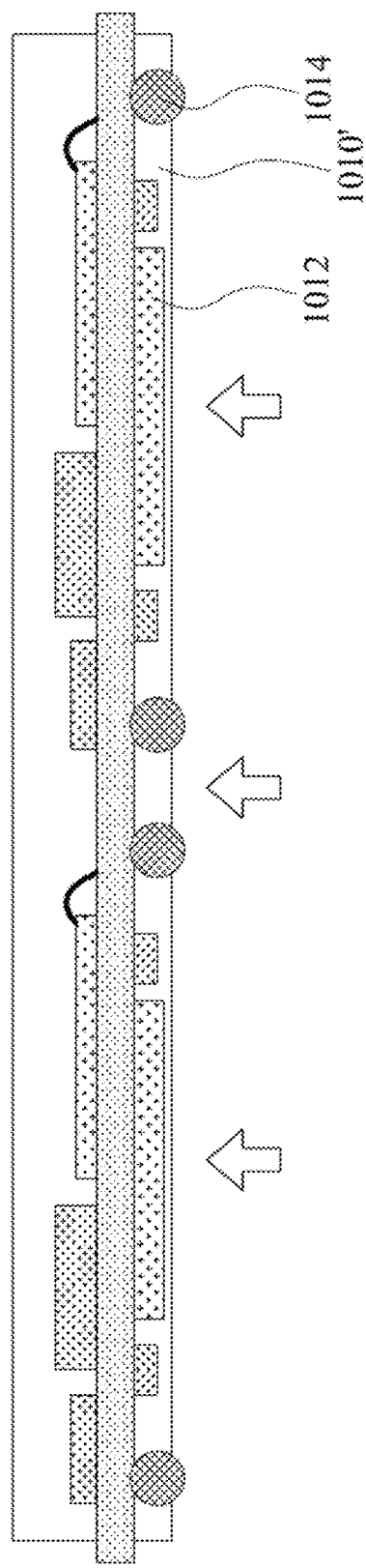
FIGS. 10A-10D show schematic illustrations of a semiconductor package during various stages of fabrication in accordance with some embodiments of the instant disclosure.

Referring to FIG. 10(A), the molding material (e.g., molding 910' from FIG. 9(F)) is cured to form a molding member 1010', which encapsulates the centrally mounted device components (e.g., die 1012) yet partially exposes the connectors (e.g., connector 1014). The curing process of the molding compound may be aided by baking or UV radiation.

In some embodiments, a planarization process is performed (e.g., visually represented by the thick arrows) over die 1012 on the bottom face (e.g., first face) of the substrate. For instance, in some embodiments where the primary device component (e.g., the chip with a largest dimension, such as die 1012) is mounted on the substrate through flip chip arrangements, a planarization process may be carried out over the molding member 1010' until exposure of a major surface of the die 1012 (e.g., the downward facing surface of the die 1012 in accordance with the illustrated orientation). Meanwhile, the connectors (e.g., connector 1014) may be partially planarized and further exposed from the molding member.

In some embodiments, a major face of the bottom die (e.g., die 1012) may be exposed through other arrangements. For instance, in some embodiments where a chip (e.g., die 1012) is mounted on the substrate through wire bonding arrangements, over planarization on the bottom face of the package module may be refrained due to the concern of bonding wire damage. In such cases, selective material removal may be performed over the bottom die (e.g., die 1012) to expose a major surface thereof (e.g., the downward facing surface). A heat sink or conductive coating may then be applied over the exposed surface of the bottom die (e.g., similar to that depicted in FIG. 6). The selective material removal may be achieved through a laser ablation process. In other embodiments, a heat sink (not shown in the instant illustration) may be mounted to a bottom face of the die (e.g., die 1012) before the deposition process of molding compound (e.g., molding 1010').

Figure 10B:
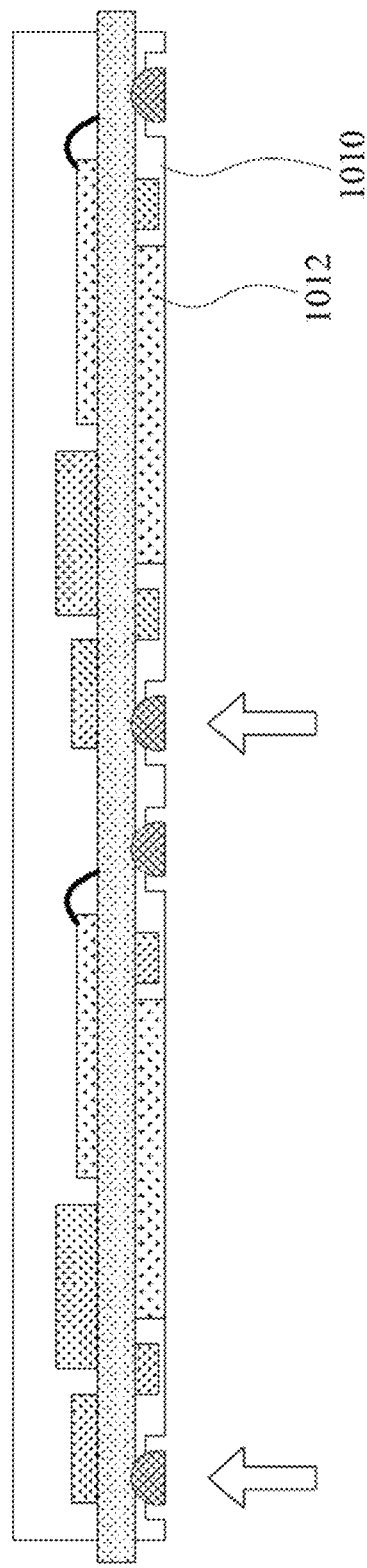

Referring to FIG. 10(B), upon planarization of the bottom package surface, a planarized molding member (e.g., member 1010) may be formed.

In some embodiments, a selective material removal process may be further performed to enlarge access to the plurality of connectors (which are partially exposed from the molding member 1010). The selective material removal may be achieved through, e.g., a laser ablation process. In some embodiments, the laser ablation process respectively removed a portion of the molding material around each of the connectors (e.g., connector 1014), thereby generating an enclosing trench profile around the exposed portion of a respective connector (e.g., similar to that depicted in FIG. 2). In some embodiments, the enlargement of connector access is performed to ensure proper masking/proper connection between the connectors and a subsequently formed shielding member (e.g., member 1132 as shown in FIG. 11(B)).

However, in some scenarios, e.g., when a thickness of the solder ball/connector is about half ball diameter, the exposure of the connector may be deemed sufficient. In such cases, an additional laser opening process may be omitted.

Figure 10C:
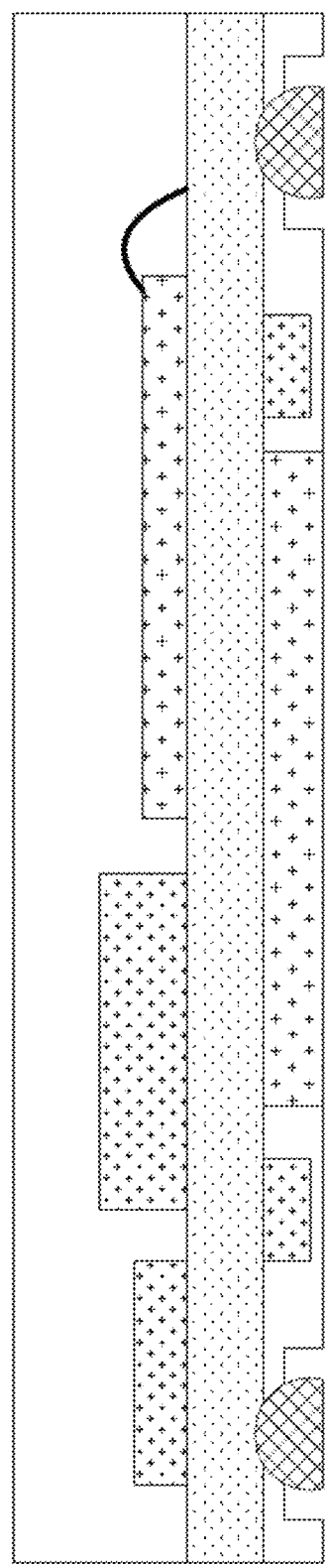

Referring to FIG. 10(C), a singulation process is performed, where an array of batch processed package modules are separated into individual units.

Figure 10D:
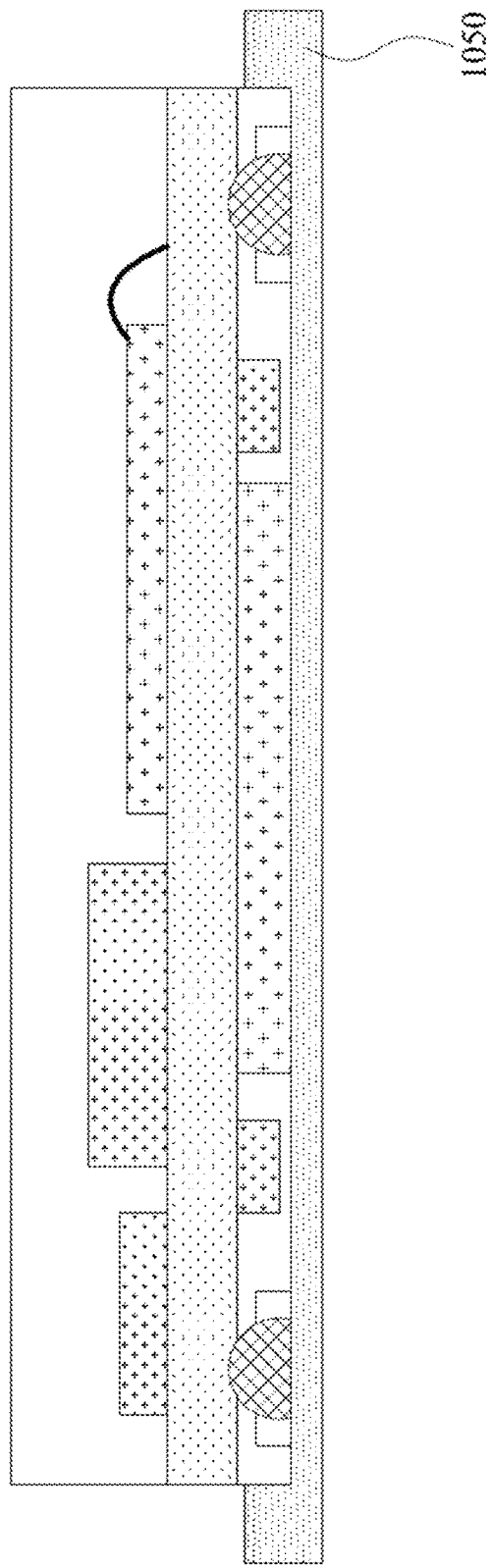

Referring to FIG. 10(D), to facilitate subsequent shield deposition operations, a singulated package unit is placed onto a temporary retainer. In some embodiments, the temporary retainer may comprise a flexible material (such as die attachment tap 1050). In some embodiments, the package unit under processing sinks slightly into the tap 1050 upon placement. In such embodiments, the flexible material of the tap 1050 would mask a lateral edge region of a lateral surface of the bottom molding member (e.g., member 1010). In some embodiments, the masked portion of the package module falls substantially in a lower periphery of the molding member (e.g., lower side walls of the molding 1010).

FIG. 11 shows schematic illustration of a semiconductor package during various stages of fabrication in accordance with some embodiments of the instant disclosure. Please note that, the element numerals of some prior-labeled components may be omitted in subsequent drawings for the clarity of illustration.

Figure 11A:
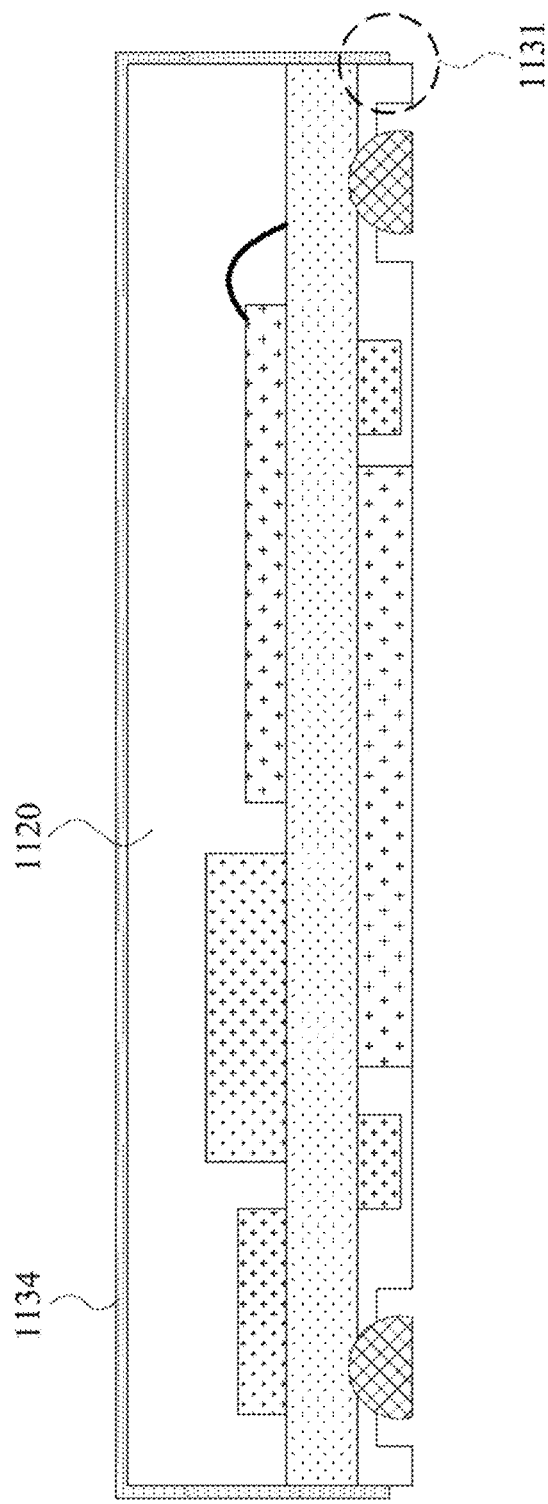
FIGS. 11A-11B show schematic illustrations of a semiconductor package during various stages of fabrication in accordance with some embodiments of the instant disclosure.
Figure 11B:
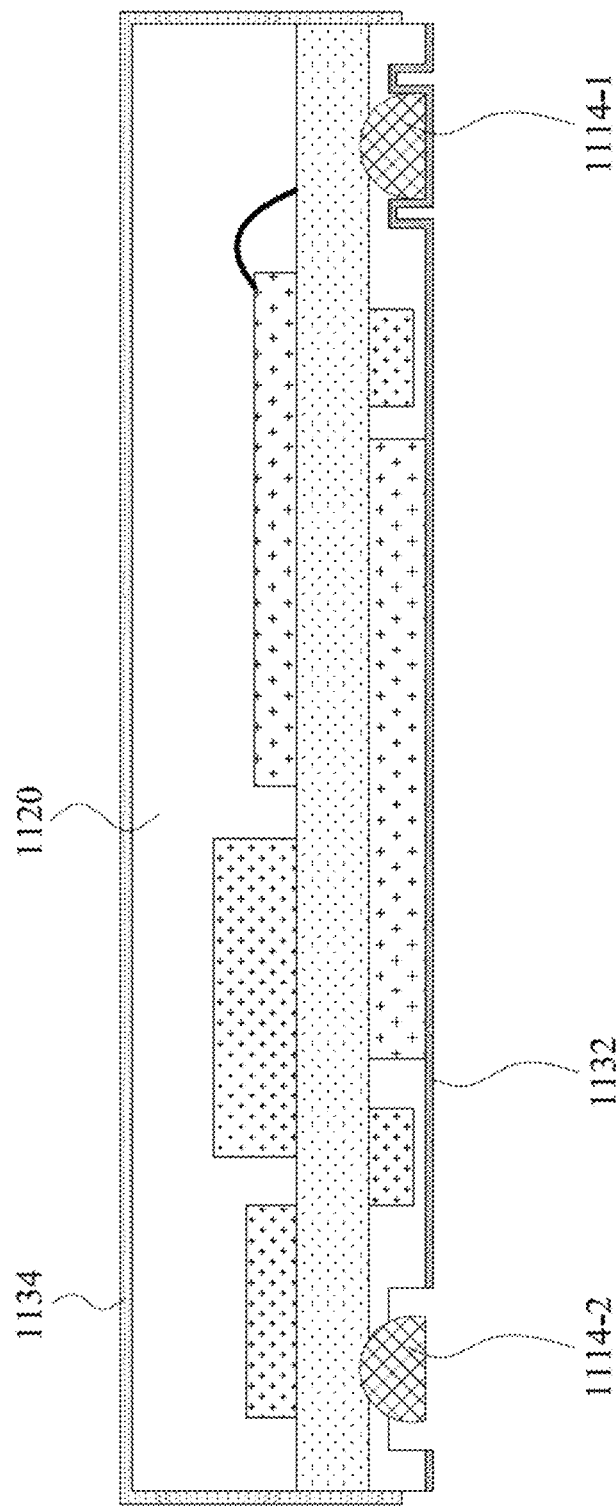
Figure 12B:
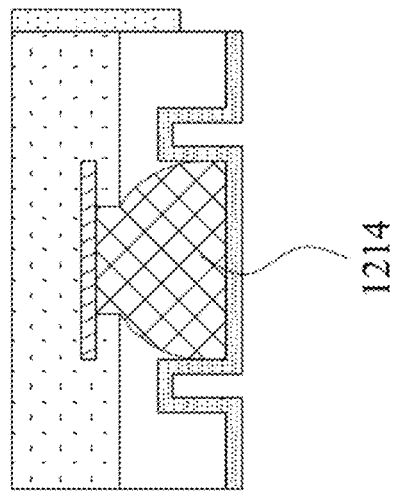
FIGS. 12A-12H show schematic local enlargement views of a semiconductor package in accordance with some embodiments of the instant disclosure.
Figure 12A:
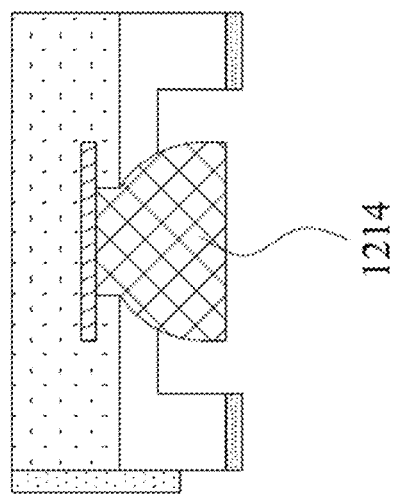
Figure 12D:
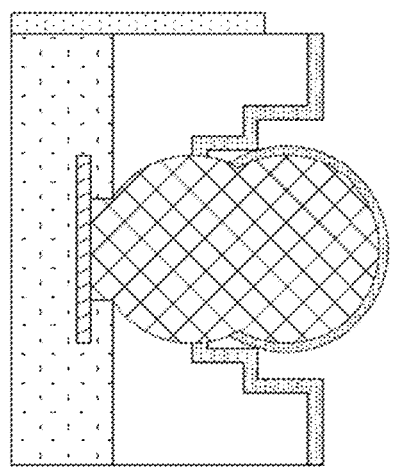
Figure 12C:
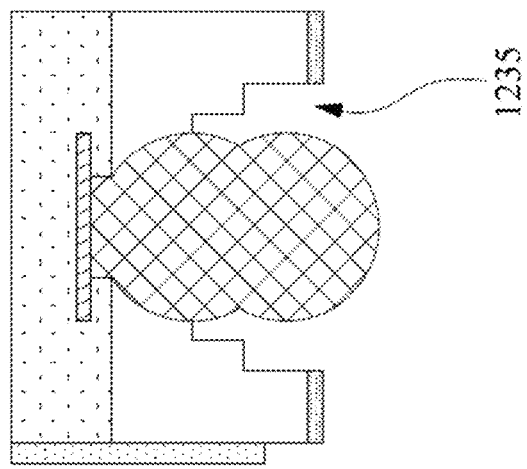
Figure 12F:
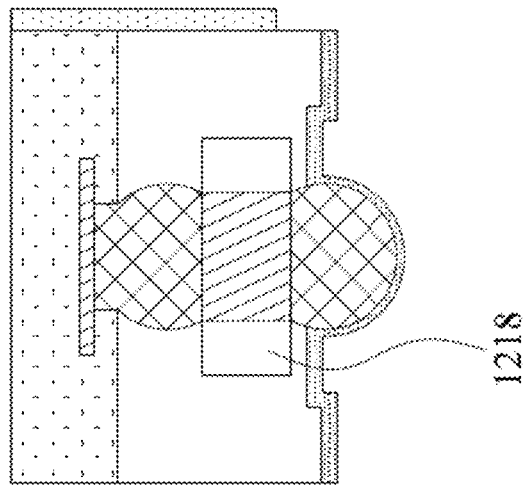
Figure 12E:
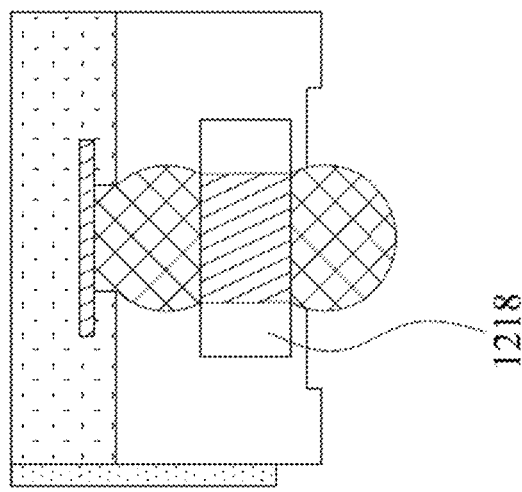
Figure 12G:
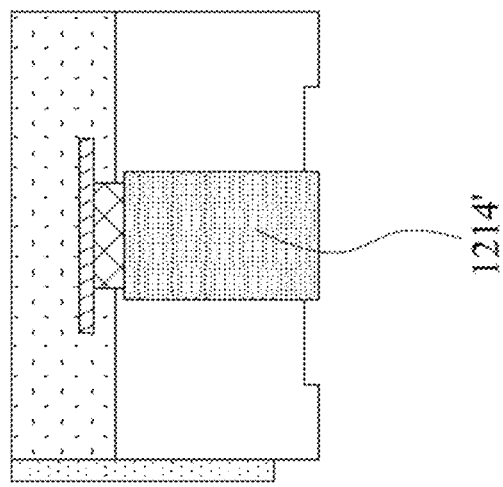
Figure 12H:
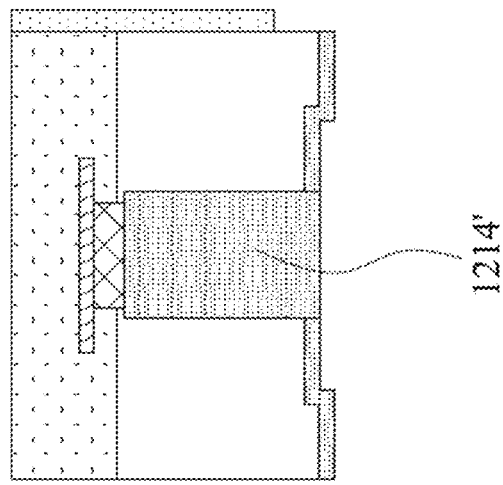

Referring to FIG. 11(A), a shield deposition operation is carried out over the upper quadrants of the package unit under processing. For instance, conductive material is disposed over the upward-exposed surfaces of the upper molding member (e.g., molding member 1134) to form a three dimensional, multi-aspect shielding member (e.g., shielding member 1134).

In some embodiments, thin film deposition techniques (e.g., electro-plating, sputtering) may be used to form low-profile, conformal shielding structures over the molding member 1134. In some embodiments, the conductive material for the shielding member 1134 may possess good electrical and/or thermal conductive characteristics, such as a metal material or metal alloy depicted in the previous discussions.

In some embodiments, the shield deposition process is performed while the diced package unit is retained over a flexible tape (e.g., die attachment tap 1050). The lower periphery of the lateral wall masked by the flexible tape (e.g., region 1131 as enclosed by the dotted circle) thus may not receive shielding coverage from the upper shielding member (e.g., member 1134).

Referring to FIG. 11(B), another shield deposition operation is carried out over the bottom face of the package unit under processing. The deposition operation forms a bottom shielding member (e.g., shielding member 1132) that provides planar coverage over the bottom face of the package unit.

During the shield deposition process, a variety of mask arrangements may be used to attain selective exposure of certain group of connectors (e.g., connector 1114-2). For instance, in some embodiments, a reusable mask (e.g., as depicted with respect to FIG. 4) may be used in favor of cost effectiveness and fabrication efficiency. In some embodiments, the mask comprises a frame type construction having masking features (e.g., runner feature 437 as shown in FIG. 4) extending respectively from an edge region of the package bottom face to cover the group of connectors to be exposed from shielding (e.g., connector 1114-2). Accordingly, a shielding member 1132 that selectively covers a first group of connectors (e.g., connector 1114-1) while exposing a second group (e.g., connector 1114-2) may be formed. In such embodiments, a notch profile (e.g., as illustrated in FIG. 4) may be left along an edge portion of the bottom shielding member (e.g., member 1132) as a result.

In some embodiments, a single-use mask may be used to achieve selective exposure of certain group of connectors (e.g., connector 1114-2). In some embodiments, the mask may be defined by a photo-resist layer, which is patterned to expose a first group of the connectors configured to receive shielding (e.g., connectors 1114-1), while covering a second group of connectors to be exposed (e.g., connectors 1114-2). In some embodiments, the bottom shielding member 1132 is formed in contact with the first group of the connectors (e.g., 1114-1). Upon completion of the shield deposition process, the mask may be removed (e.g., by laser stripping, etching, or other suitable techniques).

In some embodiments, the bottom shielding member (e.g., shielding member 1132) is configured to provide planar coverage over the bottom face of package module. In some embodiments, the upper shielding member 1134 and the bottom shielding member 1132 structurally disjoint each other (for instance, an lower edge/boundary of the upper shielding member 1134 does not overlap an upper edge/boundary of the bottom shielding member 1132 at an edge region 1131 of the package module). Nevertheless, in some embodiments, a shield deposition conditions may be adjusted to extend the coverage of the bottom shielding member 1132, thus bringing the upper and the lower shielding members 1134, 1132 into structural conjunction (e.g., an overlapping configuration as illustrated in FIG. 5).

FIG. 12 shows schematic local enlargement views of a semiconductor package in accordance with some embodiments of the instant disclosure. For instance, enlargement views (1)-(8) of FIG. 12 illustrate a variety of applicable configurations for a first group of connectors (e.g., the shielded connectors) and a second group of connectors (e.g., the exposed connectors).

FIG. 12(1) and FIG. 12(2) shows a standard single metal ball arrangement for the first and second groups of connectors (e.g., connectors 1214). As these typical profiles of the exposed type/shielded type connectors have been discussed in detail with respect to previous embodiments, further depictions thereof will be omitted in favor of the brevity of disclosure.

Referring to FIG. 12(3) and FIG. 12(4), a double metal ball configuration that utilizes a stack of metal balls is illustrated. In some embodiments, the stack of longitudinally arranged metal balls help to increase standoff clearance between the signal pads. In some embodiments, the stack of metal balls allow connectors of smaller dimension specification (e.g., smaller diameter) to be used, which may increase component accessibility and cost-effectiveness. In order to ensure proper clearance and to prevent shorting, a double step trench profile (e.g., profile 1235) may be generated about the lateral periphery of the stacked connectors, as sown in the instant illustrations.

Referring to FIG. 12(5) and FIG. 12(6), a metal ball to frame board sandwich configuration is illustrated. In some embodiments, a frame board (e.g., board 1218) is placed between two longitudinally arranged metal balls of smaller diameter. In some embodiments, the frame board 1218 may comprise a ring type planar profile that has a shape corresponding to the distribution/layout of the plurality of connectors. For instance, for a package module that has a rectangular connector layout (such as that shown in FIG. 3), a frame board having an enclosing rectangular ring profile may be used to simultaneously connect all the connectors (e.g., connectors 314-1, 314-2).

Referring to FIG. 12(7) and FIG. 12(8), a copper pillar configuration is illustrated. In some embodiments, copper pillars with proper dimensions (e.g., pillars 1214') are used in place of the metal ball connectors.

Figure 13:
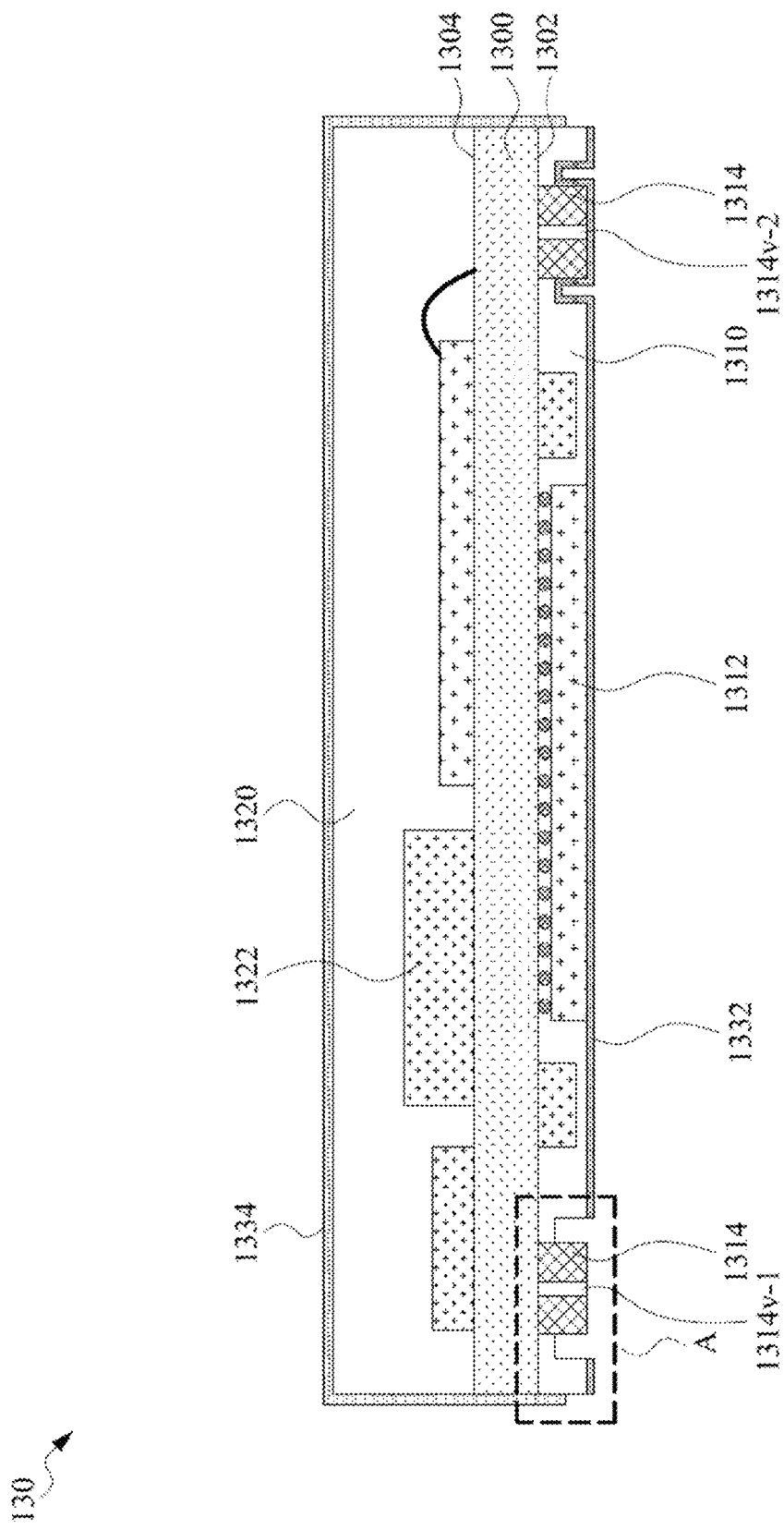
FIG. 13 shows schematic illustration of a semiconductor device in accordance with some embodiments of the instant disclosure.

FIG. 13 shows schematic illustration of a semiconductor device in accordance with some embodiments of the instant disclosure. Particularly, FIG. 13 shows a lateral cross sectional depiction of an exemplary semiconductor package 130 that provides visual access to various internal components thereof. It is noted that, some of the illustrated components comparable to those depicted in previous embodiments may not be discussed individually for the sake of disclosure brevity.

According to some embodiments of the instant disclosure, an exemplary semiconductor package (e.g., package module 130) comprises a substrate 1300 having a first face 1302 and an opposing second face 1304. On the first face 1302 mounted a plurality of electronic components (e.g., a first die 1312). In the illustrated embodiment, an interposer 1314 is used as an interface for establishing signal connections. Similar to the frame board arrangement depicted with respect to FIG. 10(5) and FIG. 10(6), the interposer 1314 may comprise a ring type planar profile shaped in correspondence with the layout of the signal connection pads. For example, in some embodiment, the interposer 1314 may be given a planar profile of a rectangular ring, in which a plurality of longitudinally arranged through silicon vias/TSVs (e.g., vias 1314v-1, 1314v-2) are distributed. The plurality of TSVs may include a first group vias (e.g., via 1314v-1) configured to be exposed from the shielding member 1332 and a second group vias (e.g., via 1314v-2) configured to be covered by the shielding member 1332. In some embodiments, the second group vias (e.g., via 1312v-2) are in electrical/thermal contact with the bottom shielding member 1332.

Accordingly, one aspect of the instant disclosure provides a semiconductor package, which comprises: a substrate having a first face and an opposing second face, wherein the first face is mounted with a first semiconductor component and a plurality of connectors; and a first shielding member covering the first semiconductor component and a first group of the plurality of connectors, while exposing a second group of the plurality of connectors.

In some embodiments, the semiconductor package further comprises: a molding member encapsulating the second face; and a second shielding member covering the molding member, wherein a upper periphery of the first shielding member has a highest boundary, wherein a lower periphery of the second shielding member has a lowest boundary, wherein the lowest boundary and the highest boundary are situated at different elevations.

In some embodiments, the second shielding member and the first shielding member are physically separated.

In some embodiments, the plurality of connectors are arranged around the first semiconductor component in a view over the first face; and the first shielding member has a plurality of notch profiles along an edge portion of the first shielding member, respectively adjacent to the exposed second group of the plurality of connectors.

In some embodiments, the first semiconductor component is in physical contact with the first shielding member.

In some embodiments, the first shielding member contacts each of the first group of the connectors.

In some embodiments, the first shielding member and the second shielding member overlap each other.

Accordingly, another aspect of the instant disclosure provides a semiconductor device, which comprises: a circuit board having a plurality of conductive pads arranged on a mounting face thereof; and a semiconductor package mounted over the circuit board, the semiconductor package comprises: a substrate having a first face arranged toward the mounting face of the circuit board, wherein the first face is mounted with a first semiconductor component and a plurality of connectors, and a first shielding member extending between a first level corresponding to the plurality of conductive pads and a second level corresponding to the plurality of connectors, wherein the shielding member is in contact with the first semiconductor component.

In some embodiments, the plurality of conductive pads of the circuit board includes at least a pad that projectively overlaps the first semiconductor component of the semiconductor package.

In some embodiments, the first shielding member is in contact with one of the plurality of conductive pads through solder.

In some embodiments, the solder between the first shielding member and the one of the plurality of conductive pads defines a first height; one of the plurality of connectors exposed by the first shielding member defines a second height; and the second height is greater than the first height.

In some embodiments, the semiconductor package further comprises: a molding member encapsulating a second face opposite to the first face; and a second shielding member covering the second molding member, wherein the first shielding member and the second shielding member are physically separated.

In some embodiments, the first shielding member comprises a first conductive material; the second shielding member comprises a second conductive material different from the first conductive material.

In some embodiments, the first semiconductor component establishes thermal connection to the conductive pads of the circuit board through the first shielding member.

Accordingly, one aspect of the instant disclosure provides an electronic package, which comprises: a carrier; an electronic component carried by the carrier; a plurality of electrical contacts configured to connect the electronic package to an external electronic device; and a shielding element configured to shield the electronic component from electromagnetic interference; wherein a first portion of the electrical contacts is electrically connected to the shielding element and a second portion of the electrical contacts is electrically dis-connected with the shielding element.

In some embodiments, the shielding element encompasses the electronic component and the first portion of the electrical contacts.

In some embodiments, the shielding element exposes the second portion of the electrical contacts.

In some embodiments, the electronic package further comprises an encapsulant encapsulating the electronic component, wherein the shielding element disposed on an outer surface of the encapsulant and the electrical contacts are exposed from the outer surface of the encapsulant.

In some embodiments, the shielding element contacts at least one of the first portion of electrical contacts.

In some embodiments, the shielding element is spaced apart from at least one of the second portion of the electrical contacts.

In some embodiments, the first portion of the electrical contacts is disposed on a bottom side of the carrier; and a first part of the shielding element is disposed on the bottom side of the carrier and configured to shield the electronic component from electromagnetic interference being into the bottom side of the carrier Accordingly, one aspect of the instant disclosure provides a method of fabricating a semiconductor package, which comprises: receiving a substrate having a first face and an opposing second face, wherein the first face is provided with a first molding member that embeds a first die and a plurality of connectors around the first die; and forming a first shielding member over the first molding member to selectively cover a first group of the plurality of connectors, while exposing a second group thereof.

In some embodiments, the forming of a first shielding member comprises disposing a first conductive material over the first die on the first face and in contact with the first group of the connectors.

In some embodiments, the forming of a first shielding member comprises: retaining the semiconductor package undergoing processing on a flexible material while performing the disposing of a first conductive material, wherein the flexible material masks an edge region of a lateral surface of the first molding member.

In some embodiments, the forming of a first shielding member comprises: placing a mask over the first face of the substrate before performing the disposing of a second conductive material, wherein the mask comprises masking features that extend respectively from an edge region of the first face toward the second group of the connectors.

In some embodiments, the method further comprises: enlarging access to the plurality of connectors by performing laser ablation respectively around each of the plurality of connectors prior to the forming of a first shielding member.

In some embodiments, the method further comprises: performing planarization over the first die on the first face and the plurality of connectors to expose a face of the first die.

Those skilled in the art will readily observe that numerous modifications and alterations of the device and method may be made while retaining the teachings of the instant disclosure. Accordingly, the above disclosure should be construed as limited only by the metes and bounds of the appended claims.

What is claimed is:

1. A semiconductor package, comprising:
a substrate having a first face and an opposing second face, wherein the first face is mounted with a first semiconductor component and a plurality of connectors; and
a first shielding member covering the first semiconductor component and a first group of the plurality of connectors, while exposing a second group of the plurality of connectors,
wherein the first semiconductor component is in physical contact with the first shielding member.

2. The semiconductor package of claim 1,
wherein the first shielding member contacts each of the first group of the connectors.

3. The semiconductor package of claim 1,
wherein the first shielding member and a second shielding member overlap each other.

4. A semiconductor device, comprising:
a circuit board having a plurality of conductive pads arranged on a mounting face thereof and
a semiconductor package mounted over the circuit board, the semiconductor package comprising:
a substrate having a first face arranged toward the mounting face of the circuit board, wherein the first face is mounted with a first semiconductor component and a plurality of connectors;
a first shielding member extending between one of the plurality of conductive pads and one of the plurality of connectors;
a first molding member encapsulating a second face opposite to the first face; and
a second shielding member covering the second molding member, wherein the first shielding member and the second shielding member are physically separated.

5. The semiconductor device of claim 4,
wherein the first shielding member comprises a first conductive material;
wherein the second shielding member comprises a second conductive material different from the first conductive material.

6. An electronic package,
an electronic component;
a plurality of electrical contacts configured to connect the electronic package to an external electronic device; and
a shielding element configured to shield the electronic component from electromagnetic interference;
wherein a first group of the electrical contacts is electrically connected to the shielding element and a second group of the electrical contacts is electrically disconnected with the shielding element,
wherein a bottom profile of the second group of the electrical contacts protrudingly exposes from the shielding element.

7. The semiconductor package of claim 1, further comprising:
a molding member encapsulating the second face; and
a second shielding member covering the molding member,
wherein an upper periphery of the first shielding member has a highest boundary,
wherein a lower periphery of the second shielding member has a lowest boundary,
wherein the lowest boundary and the highest boundary are situated at different elevations.

8. The semiconductor package of claim 7, wherein the second shielding member and the first shielding member are physically separated.

9. The semiconductor package of claim 8,
wherein the plurality of connectors are arranged around the first semiconductor component in a view over the first face,
wherein the first shielding member has a plurality of notch profiles along an edge portion of the first shielding member, respectively adjacent to the exposed second group of the plurality of connectors.

10. The semiconductor device of claim 4,
wherein the plurality of conductive pads of the circuit board includes at least a pad that projectively overlaps the first semiconductor component of the semiconductor package.

11. The semiconductor device of claim 10,
wherein the first shielding member is in contact with one of the plurality of conductive pads through solder.

12. The semiconductor device of claim 11,
wherein the solder between the first shielding member and the one of the plurality of conductive pads defines a first height;
wherein one of the plurality of connectors exposed by the first shielding member defines a second height;
wherein the second height is greater than the first height.

13. The electronic package of claim 6, wherein the shielding element encompasses the electronic component and the first group of the electrical contacts.

14. The electronic package of claim 13, wherein the shielding element exposes the second group of the electrical contacts.

15. The electronic package of claim 6, further comprising an encapsulant encapsulating the electronic component, wherein the shielding element disposed on an outer surface of the encapsulant and the electrical contacts are exposed from the outer surface of the encapsulant.

16. The electronic package of claim 6, wherein the shielding element contacts at least one of the first group of electrical contacts.

17. The electronic package of claim 6, wherein the shielding element is spaced apart from at least one of the second group of the electrical contacts.

* * * * *